United States Patent
Nakayama

(10) Patent No.: US 8,274,589 B2
(45) Date of Patent: Sep. 25, 2012

(54) DA CONVERTER, SOLID-STATE IMAGING DEVICE, AND CAMERA SYSTEM

(75) Inventor: Hideo Nakayama, Nagasaki (JP)

(73) Assignee: Sony Corporation, Tokyo (JP)

( * ) Notice: Subject to any disclaimer, the term of this patent is extended or adjusted under 35 U.S.C. 154(b) by 371 days.

(21) Appl. No.: 12/662,073

(22) Filed: Mar. 30, 2010

(65) Prior Publication Data

US 2010/0271520 A1    Oct. 28, 2010

(30) Foreign Application Priority Data

Apr. 24, 2009  (JP) ................. 2009-105923

(51) Int. Cl.
- H04N 3/14 (2006.01)
- H04N 5/335 (2011.01)
- H04N 5/235 (2006.01)
- H04N 5/228 (2006.01)

(52) U.S. Cl. ................. 348/300; 348/222.1

(58) Field of Classification Search ............ 348/207.99, 348/222.1, 294, 300, 301, 229.1; 341/135, 341/136, 144, 126

See application file for complete search history.

(56) References Cited

U.S. PATENT DOCUMENTS

| | | | | |
|---|---|---|---|---|
| 7,504,973 B2* | 3/2009 | Inagaki | .................. | 341/139 |
| 7,723,661 B2* | 5/2010 | Hara et al. | .................. | 250/208.1 |
| 2007/0194962 A1 | 8/2007 | Asayama et al. | | |
| 2008/0048098 A1* | 2/2008 | Hara et al. | .................. | 250/208.1 |
| 2008/0150771 A1* | 6/2008 | Inagaki | .................. | 341/118 |

FOREIGN PATENT DOCUMENTS

| | | |
|---|---|---|
| JP | 2000-152082 | 5/2000 |
| JP | 2002-232291 | 8/2002 |
| JP | 2007-059991 | 3/2007 |

* cited by examiner

Primary Examiner — Nicholas Giles
(74) Attorney, Agent, or Firm — Rader Fishman & Grauer, PLLC

(57) ABSTRACT

A DA converter includes: an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential; a gain control signal generating section that generates a gain current and a non-select current according to a value of a digital gain control signal, and that generates the gain control signal by current-voltage conversion of the gain current and supplies the gain control signal to the analog signal output section; and a correction current generating section that generates, based on the non-select current of the gain control signal generating section, a correction current that complements an amount of current fluctuation due to changes in gain settings in the gain control signal generating section, and that causes the correction current to flow to the reference potential.

11 Claims, 12 Drawing Sheets

POWER SUPPLY-BASED TYPE

GROUND-BASED TYPE

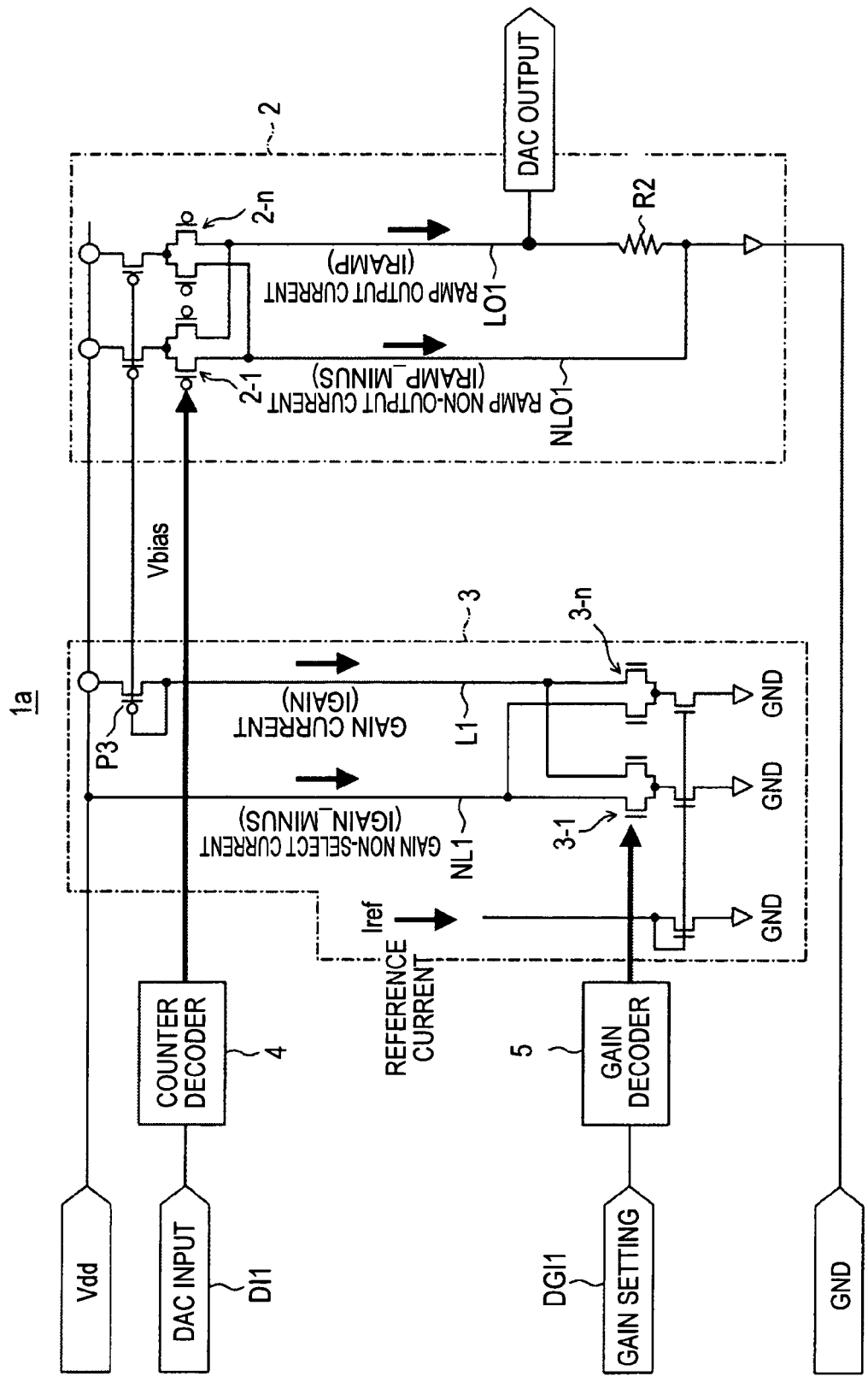

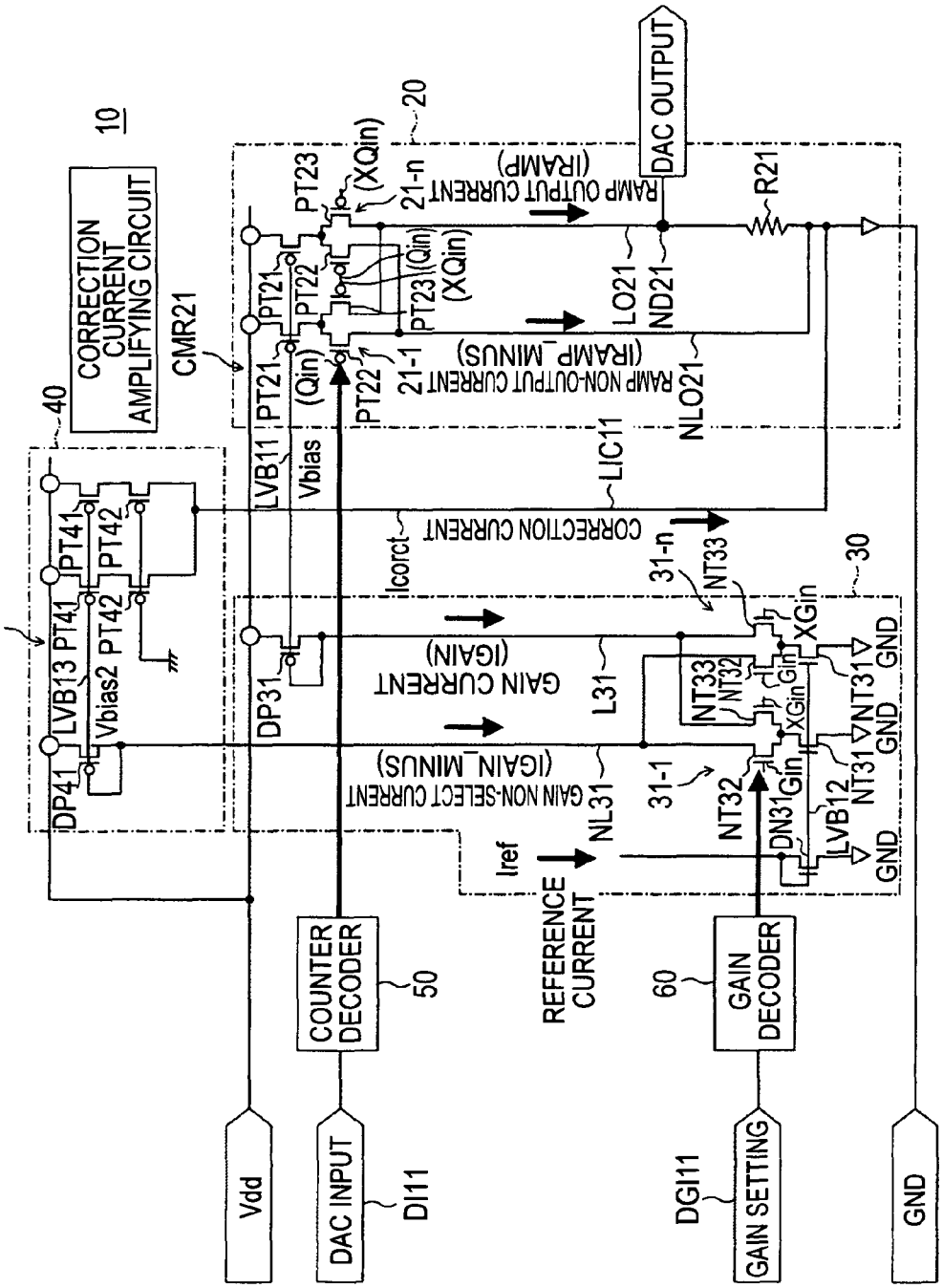

COMPARATIVE EXAMPLE

PRESENT DA CONVERTER

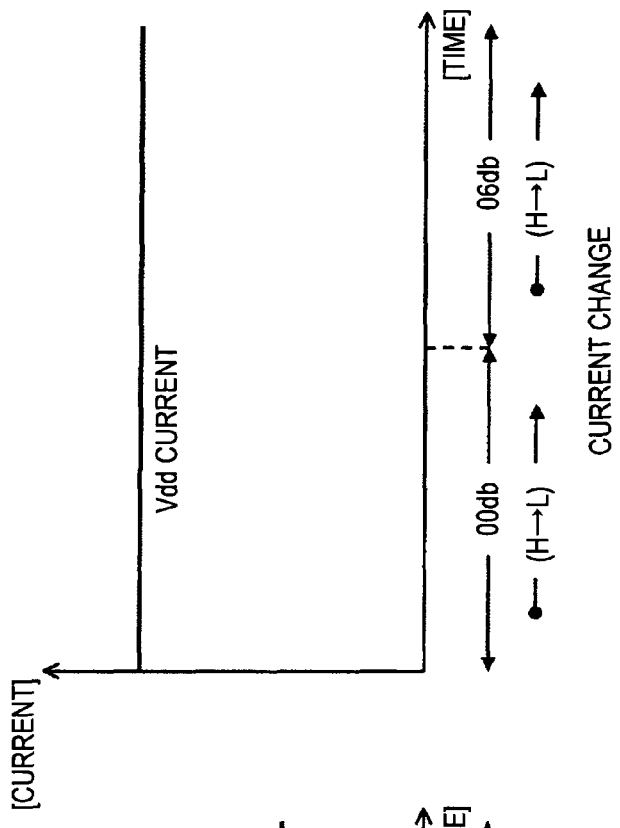
FIG.5A COMPARATIVE EXAMPLE
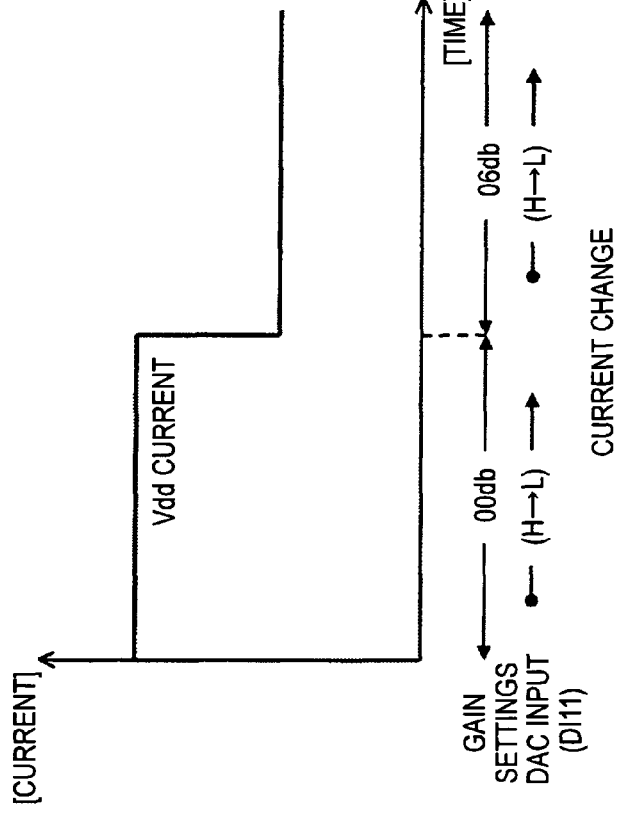
FIG.5B PRESENT DA CONVERTER

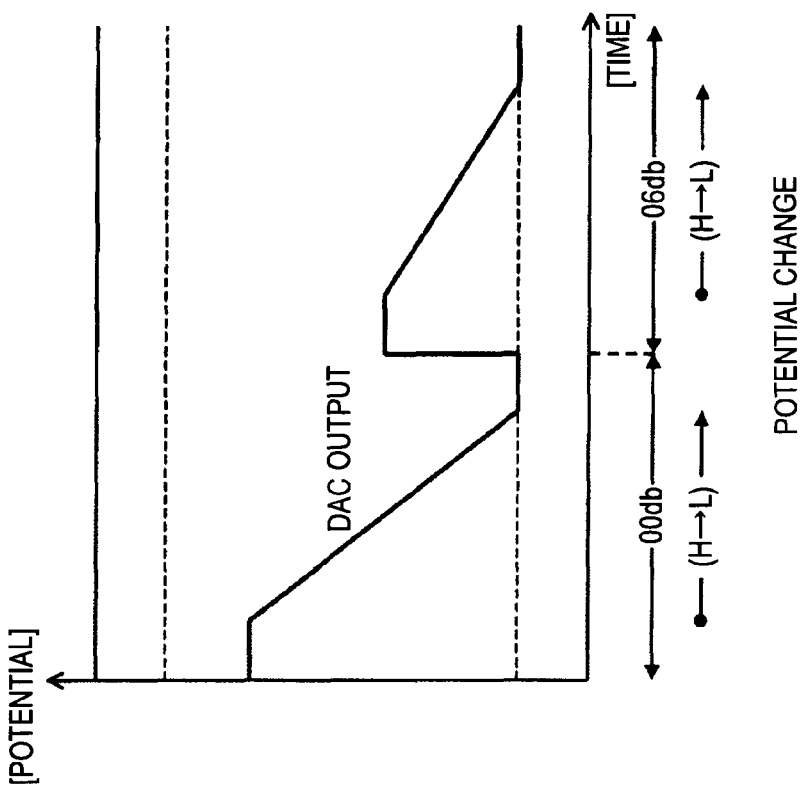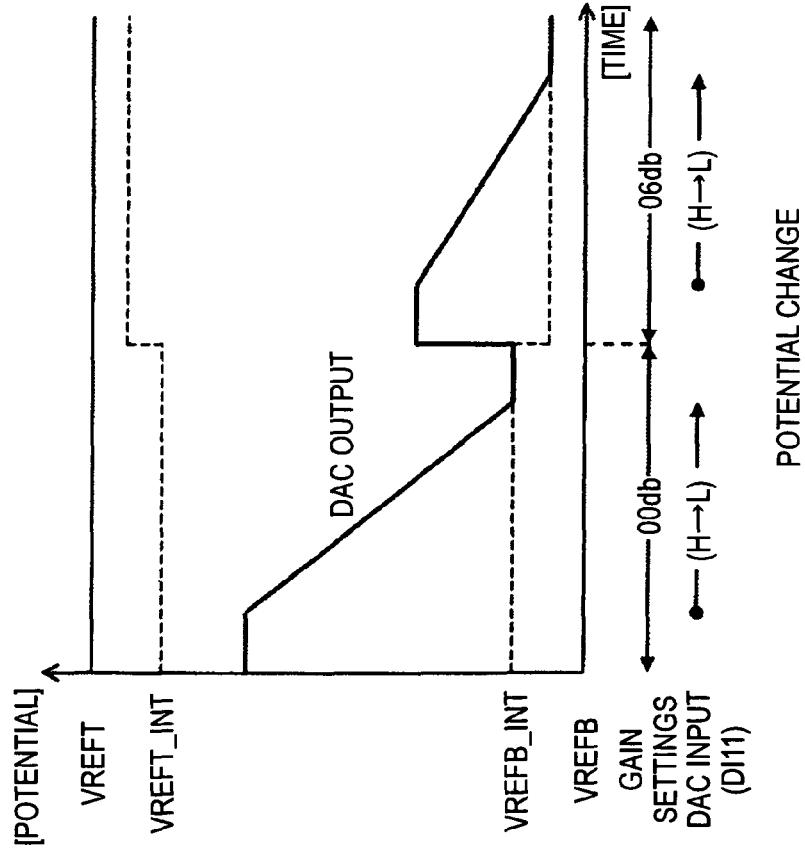

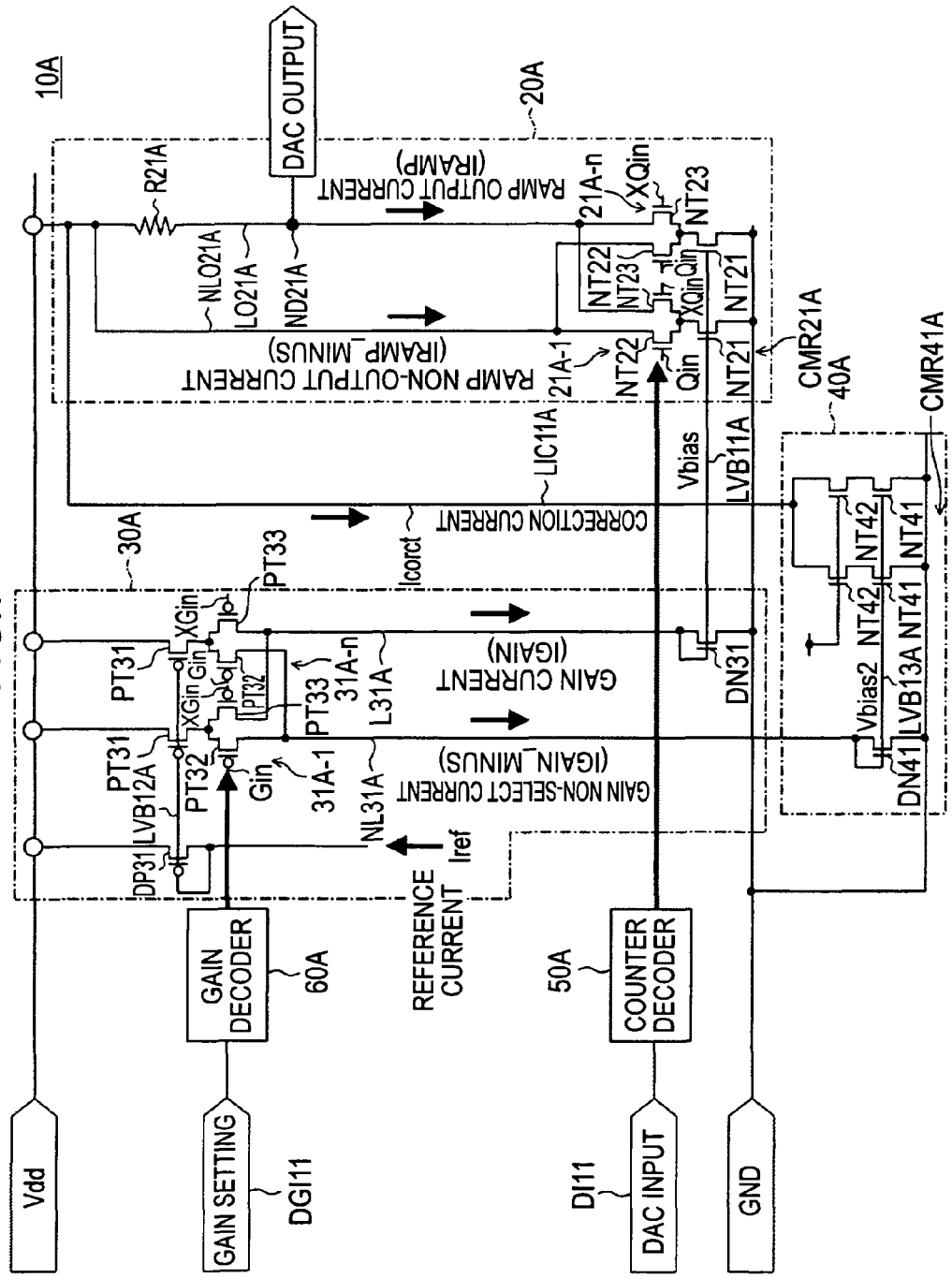

DA CONVERTER, SOLID-STATE IMAGING DEVICE, AND CAMERA SYSTEM

BACKGROUND OF THE INVENTION

1. Field of the Invention

The present invention relates to DA converters applicable to solid-state imaging devices as represented by CMOS image sensors. The invention also concerns solid-state imaging devices, and camera systems.

2. Description of the Related Art

Generally, the current-controlled digital-analog converter (hereinafter, "DA converter (digital analog converter)") is structured from a plurality of basic current supply cells that generates a constant current, and an output resistor provided as a current-voltage converter.

FIGS. 1A and 1B are schematic diagrams explaining basic structures of a current-controlled DA converter.

FIG. 1A represents a ground GND-based structure. FIG. 1B represents a structure based on power supply Vdd.

Basically, DA converters 1a and 1b are structured to include a base resistor R1, a counter CNT1, and a current supply I1 including a plurality of basic current supply cells.

In the ground-based DA converter 1a illustrated in FIG. 1A, the base resistor R1 is connected on the ground GND side, whereas the base resistor R1 is connected on the power supply Vdd side in the power supply-based DA converter 1b of FIG. 1B.

In the DA converters 1a and 1b, the input clock CLK to the counter CNT1 is counted, the number of selected basic current supply cells in the current supply is determined based on the counted value, and the resulting current is flown to the base resistor R1 to provide a ramp waveform for the voltage of the resistance value.

FIG. 2 is a circuit diagram illustrating a specific exemplary configuration of the ground-based DA converter (see, for example, JP-A-2007-59991 disclosing a DA converter, an AD converter, and a semiconductor device).

A ground-based DA converter 1a illustrated in FIG. 2 includes an analog signal output section 2, a gain control signal generating section 3, a counter decoder 4, and a gain decoder 5.

The analog signal output section 2 generates an analog signal according to a value of a digital input signal DI1 decoded in the counter decoder 4. The analog signal output section 2 adjusts the gain of the analog signal generated according to a bias voltage Vbias supplied as a gain control signal from the gain control signal generating section 3.

The analog signal output section 2 illustrated in FIG. 2 includes a plurality of basic current supply cells 2-1 to 2-n, each including a differential transistor, and a transistor provided as a current supply for the differential transistor. The basic current supply cells 2-1 to 2-n receive a common bias voltage through the gates of the current supply transistors.

In the ground-based DA converter 1a, the basic current supply cells 2-1 to 2-n are formed by p-channel MOS (PMOS) transistors.

The analog signal output section 2 includes a select output line LO1, a non-select output line NLO1, and an output resistor R2 that serves as a current-voltage converting circuit (IV converting circuit).

In the basic current supply cells 2-1 to 2-n, the drains of one of the transistors of the differential transistors are commonly connected to the select output line L01, and the drains of the other transistors are commonly connected to the non-select output line NLO1.

The select output line LO1 is connected to ground GND via the output resistor R2. The non-select output line NLO1 is directly connected to ground GND.

One of the transistors of the differential transistors in the basic current supply cells 2-1 to 2-n are selected according to the decode information from the counter decoder 4. In response, the current outputs of the selected basic current supply cells are added to produce an output current Iramp that flows into the select output line L01. The current Iramp is output after being converted to a voltage signal in the output resistor R2.

When the other transistors are selected in the basic current supply cells 2-1 to 2-n according to the decode information from the counter decoder 4, the current outputs of the selected basic current supply cells is added to produce a non-output current Iramp_minus that flows into ground GND via the non-select output line NLO1.

The gain control signal generating section 3 generates a bias voltage Vbias as a gain control signal that depends on the value of the digital gain control signal DGI1 decoded by the gain decoder 5.

The gain control signal generating section 3 illustrated in FIG. 2 includes a plurality of basic current supply cells 3-1 to 3-n, each including a differential transistor, and a current supply transistor for the differential transistor.

The basic current supply cells 3-1 to 3-n receive a bias voltage according to a common reference current through the gates of the current supply transistors.

In the ground-based DA converter 1a, the basic current supply cells 3-1 to 3-n are formed by n-channel MOS (NMOS) transistors.

The gain control signal generating section 3 includes a select line L1, a non-select line NL1, and a diode-connected PMOS transistor P3 that serves as an IV converting circuit.

The drains of one of the transistors of the differential transistors in the basic current supply cells 3-1 to 3-n are commonly connected to the select line L1, whereas the drains of the other transistors are commonly connected to the non-select line NL1.

The select line L1 is connected to the drain and gate of the PMOS transistor P3, and the connection node is connected to the gates of the current supply transistors of the basic current supply cells 2-1 to 2-n in the analog signal output section 2.

Specifically, a current mirror circuit is formed by the PMOS transistor P3 and the current supply transistors of the basic current supply cells 2-1 to 2-n.

The non-select line NL1 is directly connected to the power supply Vdd.

One of the transistors of the differential transistors in the basic current supply cells 3-1 to 3-n are selected according to the decode information from the gain decoder 5.

In response, the current outputs of the selected basic current supply cells are added to produce a gain current Igain that flows into the select line L1. The gain current Igain is converted to a voltage signal in the PMOS transistor P3, and output to the analog signal output section 2.

When the other transistors are selected in the basic current supply cells 3-1 to 3-n according to the decode information from the gain decoder 5, the current outputs of the selected basic current supply cells are added to produce a non-select current Igain_minus that flows into the power supply Vdd via the non-select line NL1.

Such current-controlled DA converters are also used as analog-digital converters (hereinafter, "AD converter (analog digital converter)") that perform the analog-digital conversion of the pixel signals in a solid-state imaging device (image sensor) that includes a matrix array of unit pixels.

Solid-state imaging devices including this type of AD converter are disclosed in, for example, JP-A-2007-59991 (DA converter, AD converter, semiconductor device), JP-A-2000-152082 (image sensor), and JP-A-2002-232291 (analog-digital converter, and image sensor using same).

In the solid-state imaging devices described in these publications, the analog pixel signals selected per line or per pixel are compared with a reference voltage (ramp waveform RAMP) that has been monotonously varied for analog to digital conversion, using a voltage comparator.

Concurrently with the comparison process, the solid-state imaging device performs a count process in a counter section, and acquires the digital signal of the pixel signal based on the counted value at the completion of the comparison process.

SUMMARY OF THE INVENTION

However, the DA converters described above involve current fluctuations in the analog signal output section 2 that occur in proportion to the fluctuations of the gain current Igain depending on the settings conditions of the gain control signal generating section 3.

As a result, in the analog signal output section 2, the total current of the output current Iramp and the non-output current Iramp_minus fluctuates proportionally to the gain current Igain.

This leads to fluctuations in the overall consumed current of the DA converter.

The current fluctuations in the DA converter cause fluctuations in the power supply Vdd level and ground GND level by, for example, the parasitic resistance or parasitic inductance of the power supply Vdd or ground GND, which in turn causes output fluctuations in the DA converter. The DA converter thus requires a settling time to stabilize current.

The settling time at gain switching is a particularly important issue in image sensors adapted to switch gains for each column scan.

This is described below with reference to FIG. 1 of JP-A-2007-59991.

The settling time is not a serious issue in the column scan of different colors in a screen under the same gain settings, because in this case the settling time at gain switching becomes a factor only when switching the screens.

However, the settling time at gain switching becomes an important factor when gain settings are different for each color and thus require gain switching for each column scan.

Referring to FIG. 1 of JP-A-2007-59991, pixel signals R, G, R, G and so on are fed to the vertical signal line H1 one after another in the sequential scan of row control lines V1, V2, V3 and so on.

Pixel signals G, B, G, B and so on are sequentially supplied to the vertical signal line H2.

When gain settings are different for each color, the gain settings of the two DA converters DACa and DACb need to be alternately switched at each column scan.

Such circuit configurations with different gain settings for each color are used in system architectures in which white balance is adjusted with different gain settings for each different color on the sensor side.

In this type of circuit, the consumed current in the DA converter greatly varies in each column scan, and care needs be taken for the response characteristics of the power-supply system circuit using an on-board set.

Further, because a wider frequency band is required for the power-supply system to reduce settling time, such circuit design is disadvantageous in terms of noise prevention particularly in the power supply-based DA converter.

Accordingly, there is a need for a DA converter, a solid-state imaging device, and a camera system capable of maintaining the consumed current constant regardless of the gain settings, and reducing the settling time provided for the stable operation of the device at gain switching.

A DA converter according to an embodiment of the present invention includes: an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential; a gain control signal generating section that generates a gain current and a non-select current according to a value of a digital gain control signal, and that generates the gain control signal by current-voltage conversion of the gain current and supplies the gain control signal to the analog signal output section; and a correction current generating section that generates, based on the non-select current of the gain control signal generating section, a correction current that complements an amount of current fluctuation due to changes in gain settings in the gain control signal generating section, and that causes the correction current to flow to the reference potential.

A solid-state imaging device according to another embodiment of the present invention includes: a pixel section in which a plurality of pixels that performs photoelectric conversion is disposed in rows and columns; a pixel signal read circuit that reads a pixel signal from the pixel section in units of pixels; and a DA converter that generates a reference voltage of a ramp wave according to a supplied digital signal.

The pixel signal read circuit includes: a plurality of comparators respectively corresponding to the columns of pixels, and that receives the reference voltage of a ramp wave and compares the reference voltage with an analog signal potential read out from the pixels of each column; and a plurality of latches disposed to respectively correspond to the comparators and the columns of pixels, and capable of counting a comparison time of the corresponding comparators in such a manner as to stop counting and hold the counted value upon inversion of a comparator output.

The DA converter includes: an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential; again control signal generating section that generates a gain current and a non-select current according to a value of a digital gain control signal, and that generates the gain control signal by current-voltage conversion of the gain current and supplies the gain control signal to the analog signal output section; and a correction current generating section that generates, based on the non-select current of the gain control signal generating section, a correction current that complements an amount of current fluctuation due to changes in gain settings in the gain control signal generating section, and that causes the correction current to flow to the reference potential.

A camera system according to still another embodiment of the present invention includes: a solid-state imaging device; and an optical system that forms an image of an object on the solid-state imaging device.

The solid-state imaging device includes: a pixel section in which a plurality of pixels that performs photoelectric conversion is disposed in rows and columns; a pixel signal read circuit that reads a pixel signal from the pixel section in units of pixels; and a DA converter that generates a reference voltage of a ramp wave according to a supplied digital signal.

The pixel signal read circuit includes: a plurality of comparators respectively corresponding to the columns of pixels, and that receives the reference voltage of a ramp wave and compares the reference voltage with an analog signal potential read out from the pixels of each column; and a plurality of latches disposed to respectively correspond to the comparators and the columns of pixels, and capable of counting a comparison time of the corresponding comparators in such a manner as to stop counting and hold the counted value upon inversion of a comparator output.

The DA converter includes: an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential; a gain control signal generating section that generates a gain current and a non-select current according to a value of a digital gain control signal, and that generates the gain control signal by current-voltage conversion of the gain current and supplies the gain control signal to the analog signal output section; and a correction current generating section that generates, based on the non-select current of the gain control signal generating section, a correction current that complements an amount of current fluctuation due to changes in gain settings in the gain control signal generating section, and that causes the correction current to flow to the reference potential.

According to the embodiments of the present invention, the consumed current can advantageously be maintained constant regardless of the gain settings, and the settling time for the stable operation of the device at gain switching can be reduced.

BRIEF DESCRIPTION OF THE DRAWINGS

FIG. 2 is a circuit diagram illustrating a specific exemplary configuration of a ground-based DA converter.

FIG. 3 is a circuit diagram illustrating an exemplary configuration of a DA converter according to a First Embodiment of the present invention.

FIGS. 5A and 5B are diagrams representing current fluctuations with time in the presence of gain switching.

FIGS. 6A and 6B are diagrams representing output fluctuations of a DA converter with time in the presence of gain switching.

FIG. 7 is a circuit diagram illustrating an exemplary configuration of a DA converter according to a Second Embodiment of the present invention.

DESCRIPTION OF THE PREFERRED EMBODIMENTS

Figure 1B:
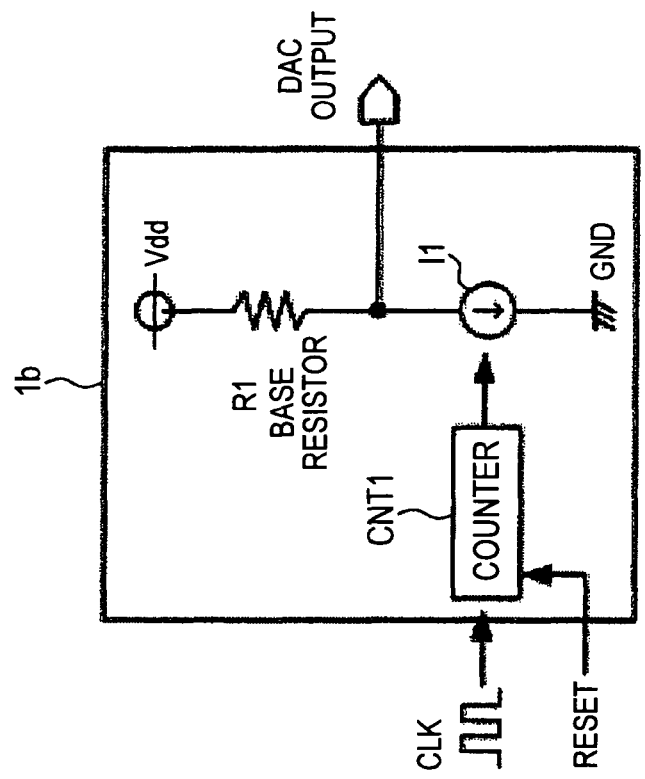
FIGS. 1A and 1B are diagrams illustrating an exemplary configuration of a current-controlled DA converter.
Figure 1A:
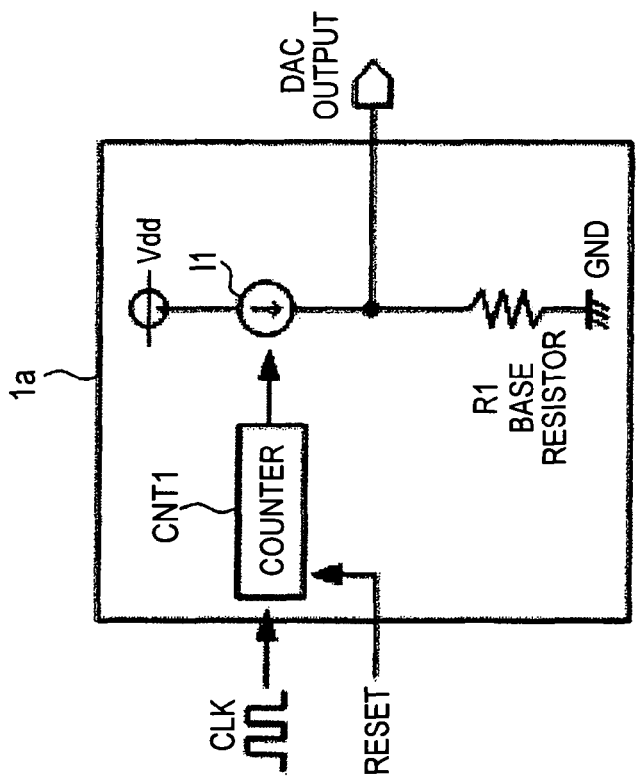

Embodiments of the present invention are described below with reference to the accompanying drawings.

Descriptions will be made in the following order.

1. First Embodiment (first exemplary configuration of a DA converter)
2. Second Embodiment (second exemplary configuration of a DA converter)
3. Third Embodiment (exemplary overall configuration of a solid-state imaging device)
4. Fourth Embodiment (exemplary configuration of a camera system)

1. First Embodiment

First Exemplary Configuration of DA Converter

FIG. 3 is a circuit diagram illustrating an exemplary configuration of a DA converter according to a First Embodiment of the present invention.

A DA converter 10 of the First Embodiment is configured as a ground-based DA converter.

The DA converter 10 includes an analog signal output section 20, a gain control signal generating section 30, a correction current amplifying circuit 40 provided as a correction current generating section, a counter decoder 50, and a gain decoder 60.

The analog signal output section 20 generates an analog signal according to a value of a digital input signal DI11 decoded by the counter decoder 50.

The analog signal output section 20 adjusts the gain of the analog signal generated according to a bias voltage Vbias supplied as a gain control signal from the gain control signal generating section 30.

The analog signal output section 20 illustrated in FIG. 3 includes a plurality of basic current supply cells 21-1 to 21-$n$, each including a differential transistor, and a transistor provided as a current supply for the differential transistor. The basic current supply cells 21-1 to 21-$n$ receive a common bias voltage through the gates of first current supply transistors.

In the ground-based DA converter 10, the basic current supply cells 21-1 to 21-$n$ are formed by PMOS transistors.

The analog signal output section 20 also includes a select output line LO21, a non-select output line NLO21, and an output resistor R21 that serves as an IV converting circuit.

The basic current supply cells 21-1 to 21-$n$ of the analog signal output section 20 have a common structure.

Specifically, the basic current supply cells 21(-1 to -$n$) each include PMOS transistors PT21 to PT23.

The PMOS transistor PT21 forms the first current supply transistor serving as the current supply.

The PMOS transistors PT22 and PT23 form a differential transistor by being connected to each other at the source.

In the basic current supply cells 21, the source of the PMOS transistor PT21 is connected to a power supply Vdd, and the drain to the sources of the PMOS transistors PT22 and PT23.

The drain of the PMOS transistor PT22 is connected to the non-select output line NLO21, which is directly connected to ground GND.

The drain of the PMOS transistor PT23 is connected to the select output line LO21, which is connected to one end of the output resistor R21. The other end of the output resistor R21 is connected to ground GND.

In the basic current supply cells 21-1 to 21-*n*, the gates of the PMOS transistors PT21 are commonly connected to a supply line LVB11 of a bias voltage Vbias—a gain control signal from the gain control signal generating section 30.

The gates of the PMOS transistors PT22 are connected to the supply line of a digital signal Qin, and the gates of the PMOS transistors PT23 are connected to the supply line of a signal xQin of the reversed phase from the digital signal Qin.

In the basic current supply cells 21-1 to 21-*n*, the drains of the PMOS transistors PT23—one of the transistors forming the differential transistor—are commonly connected to the select output line LO21, and the drains of the other PMOS transistors PT22 are commonly connected to the non-select output line NLO21.

As mentioned above, the select output line LO21 is connected to one end of the output resistor R21, and the analog signal output of the analog signal output section 20 is made at a connection node ND21.

In the analog signal output section 20, the PMOS transistors PT23 provided as one of the transistors of the differential transistors in the basic current supply cells 21-1 to 21-*n* are selected according to the decode information from the counter decoder 50.

The current outputs of the selected basic current supply cells are added to produce an output current Iramp that flows in the select output line LO21. The current Iramp is then converted into a voltage signal by the output resistor R21, and output from the node ND21.

The other PMOS transistors PT22 in the basic current supply cells 21-1 to 21-*n* are selected according to the decode information from the counter decoder 50.

In this case, the current outputs of the selected basic current supply cells are added to produce a non-output current Iramp_minus that flows into the ground GND via the non-select output line NLO21.

The non-output current Iramp_minus is corrected by a correction current Icorct of the correction current amplifying circuit 40, as will be described later.

The gain control signal generating section 30 illustrated in FIG. 3 generates the bias voltage Vbias, a gain control signal according to the value of a digital gain control signal DGI11 decoded by the gain decoder 60.

The bias voltage Vbias generated in the gain control signal generating section 30 is output to the analog signal output section 20 as a gain adjusting signal.

The gain control signal generating section 30 includes a plurality of basic current supply cells 31-1 to 31-*n*, each including a differential transistor, and a transistor provided as a current supply for the differential transistor. The basic current supply cells 31-1 to 31-*n* receive a bias voltage according to a common reference current through the gates of the current supply transistors.

In the ground-based DA converter 10, the basic current supply cells 31-1 to 31-*n* are formed by NMOS transistors.

The gain control signal generating section 30 also includes a select line L31, a non-select line NL31, and a diode-connected NMOS transistor DN31 and PMOS transistor DP31 that serve as an IV converting circuit.

The PMOS transistor DP31 corresponds to a first diode-connected transistor.

The basic current supply cells 31-1 to 31-*n* of the gain control signal generating section 30 have a common structure.

Specifically, the basic current supply cells 31(-1 to *n*) each include NMOS transistors NT31 to NT33.

The NMOS transistor NT31 forms the current supply transistor.

The NMOS transistors NT32 and NT33 form a differential transistor by being connected to each other at the source.

In the basic current supply cells 31, the source of the NMOS transistor NT31 is connected to ground GND, and the drain to the sources of the NMOS transistors NT32 and NT33.

The drain of the NMOS transistor NT32 is connected to the non-select line NL31, which is connected to the correction current amplifying circuit 40.

The drain of the NMOS transistor NT33 is connected to the select line L31.

The select line L31 is connected to the drain and gate of the PMOS transistor DP31, and the connection node is connected to the gates of the current supply transistors of the basic current supply cells 21-1 to 21-*n* in the analog signal output section 20.

Specifically, a first current mirror circuit CMR21 is formed by the PMOS transistor DP31 of the gain control signal generating section 30, and the current supply PMOS transistors PT21 of the basic current supply cells 21-1 to 21-*n* in the analog signal output section 20.

In the basic current supply cells 31-1 to 31-*n*, the gates of the NMOS transistors NT31 are commonly connected to a supply line LVB12 of a reference voltage Vref at the NMOS transistor DN31 that serves as an IV converting circuit.

The gates of the NMOS transistors NT32 are connected to a supply line of a signal Gin, and the gates of the NMOS transistors NT33 are connected to a supply line of a signal xGin of the reversed phase from the signal Gin.

The source of the NMOS transistor DN31 is connected to ground GND, and the drain and gate to a supply line of a reference current Iref. The junction (gate) is connected to the gates of the NMOS transistors NT31 of the basic current supply cells 31-1 to 31-*n*.

In the basic current supply cells 31-1 to 31-*n*, the drains of the NMOS transistors NT33—one of the transistors of the differential transistors—are commonly connected to the select line L31, and the drains of the other NMOS transistors NT32 are commonly connected to the non-select line NL31.

The NMOS transistors NT33 provided as one of the transistors of the differential transistors in the basic current supply cells 31-1 to 31-*n* are selected according to the decode information from the gain decoder 60.

The current outputs of the selected basic current supply cells are added to produce a gain current Igain that flows in the select line L31. The gain current Igain is converted to a voltage signal in the PMOS transistor DP31, and output to the analog signal output section 20.

The other transistors in the basic current supply cells 31-1 to 31-*n* are selected according to the decode information from the gain decoder 60.

In this case, the current outputs of the selected basic current supply cells are added to produce a non-select current Igain_minus supplied to the correction current amplifying circuit 40 via the non-select line NL31.

The correction current amplifying circuit 40 receives the non-select current Igain_minus via the non-select line NL31, and generates a correction current Icorct that accurately complements an amount of current fluctuation due to changes in gain settings that occur in the gain control signal generating section 30.

The correction current amplifying circuit 40 supplies the generated correction current Icorct to the junction between the non-select output line NLO21 of the analog signal output section 20 and ground GND via a correction current line LIC11.

By the correction current amplifying circuit 40, the correction current Icorct that accurately complements an amount of current fluctuation due to changes in gain settings is added to the non-output current Iramp_minus. In this way, the total consumed current in the analog signal output section and the correction current amplifying circuit 40 is maintained constant regardless of the gain settings.

Accordingly, the overall current of the DA converter 10 is maintained constant, regardless of the gain settings.

The correction current amplifying circuit 40 includes a PMOS transistor DP41 (IV converting circuit), current-supply PMOS transistors PT41, and output PMOS transistors PT42.

The PMOS transistor DP41 is diode-connected, and has the function equivalent to that of the PMOS transistor DP31 of the gain control signal generating section 30.

The PMOS transistor DP41 corresponds to a second diode-connected transistor.

The PMOS transistors PT41 have the function equivalent to that of the current-supply PMOS transistors PT21 of the basic current supply cells 21-1 to 21-n in the analog signal output section 20.

The PMOS transistors PT42 have the function equivalent to that of the PMOS transistor PT22 or PT23 in the differential transistors of the basic current supply cells 21-1 to 21-n in the analog signal output section 20.

In the correction current amplifying circuit 40, the number of parallels of the PMOS transistors PT41 and PT42 is set to the number n of the basic current supply cells 21-1 to 21-n in the analog signal output section 20.

The PMOS transistor DP41 corresponds to a second diode-connected transistor. The PMOS transistor PT41 corresponds to a second current supply transistor. The PMOS transistor PT42 corresponds to an output transistor.

The drain and gate of the PMOS transistor DP41 are connected to the non-select line NL31, and the source is connected to the power supply Vdd.

The gate of the PMOS transistor DP41 is connected to a supply line LVB13 of a bias voltage Vbias2.

The sources of the n PMOS transistors PT41 are connected to the power supply Vdd, and the drains to the sources of the PMOS transistors PT42.

The gates of the n PMOS transistors PT41 are commonly connected to the supply line LVB13 of the bias voltage Vbias2 connected to the gate of the PMOS transistor DP41.

The gates of the n PMOS transistors PT42 are commonly connected to ground GND.

Specifically, the gates of the n PMOS transistors PT42 are maintained at a ground potential, and are thus in the ON state.

The drains of the n PMOS transistors PT42 are commonly connected to one end of the correction current line LIC11. The other end of the correction current line LIC11 is connected to one end of the output resistor R21 of the analog signal output section 20, and to the junction between the non-select output line NLO21 and ground GND.

In the correction current amplifying circuit 40, a second current mirror circuit CMR41 is formed by the diode-connected PMOS transistor DP41, and the n PMOS transistors PT41.

The second current mirror circuit CMR41 has a current mirror ratio that matches the input-output current mirror ratio of the first current mirror circuit CMR21.

Note that, as described above, the current mirror circuit CMR21 is formed by the PMOS transistor DP31 of the gain control signal generating section 30, and the current-supply PMOS transistors PT21 of the basic current supply cells 21-1 to 21-n in the analog signal output section 20.

That is, the correction current amplifying circuit 40 performs current amplification at the same current mirror ratio as that of the current mirror circuit CMR21 formed by the PMOS transistor DP31 and the current-supply PMOS transistors PT21 of the basic current supply cells 21-1 to 21-n.

The following discusses the power consumption and other characteristics of a DA converter that uses the correction current amplifying circuit 40 of the present embodiment, using a DA converter without the correction current amplifying circuit as a comparative example.

Figure 4A:
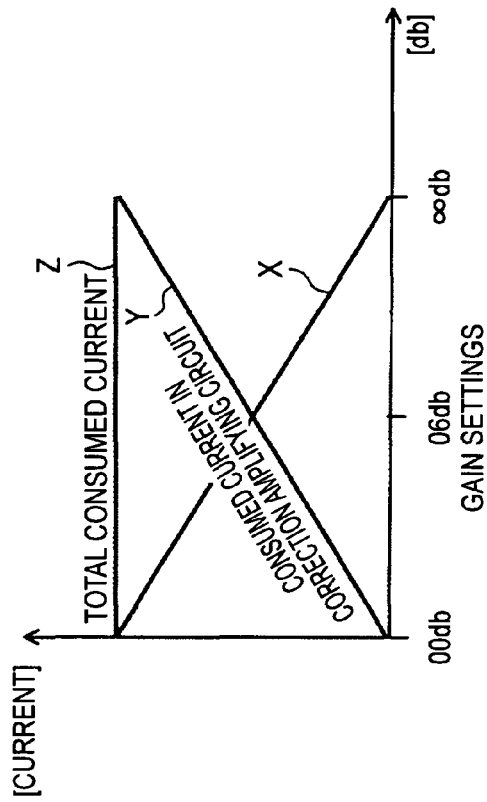
FIGS. 4A and 4B are diagrams representing current in an analog signal output section and a correction current amplifying circuit against gain settings, along with the total amount of current in the whole circuit.
Figure 4B:
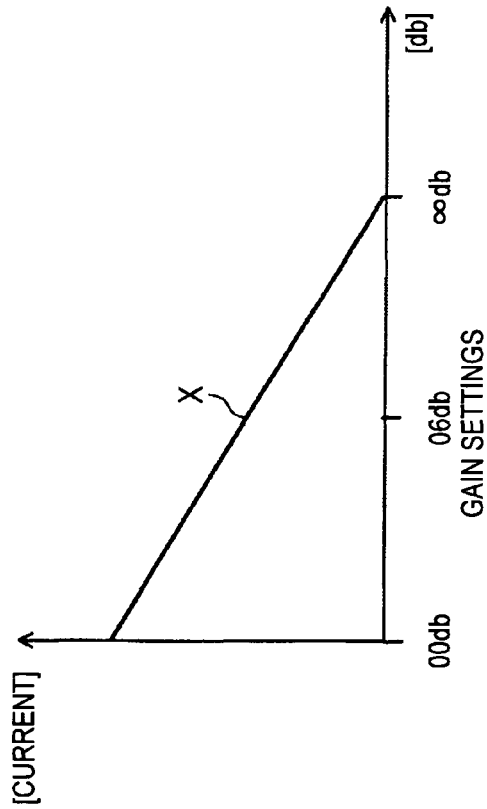

FIGS. 4A and 4B are diagrams representing current in the analog signal output section and the correction current amplifying circuit against gain settings, along with the total amount of current in the whole circuit.

FIG. 4A represents current change characteristic against changes in gain settings in the comparative example. FIG. 4B represents current change characteristic against changes in gain settings in the DA converter that uses the correction current amplifying circuit of the presently described embodiment.

In FIGS. 4A and 4B, the horizontal axis represents gain settings value, and the vertical axis represents current. Further, in FIGS. 4A and 4B, the line X represents changes in consumed current in the analog signal output section 20.

In FIG. 4B, the line Y represents changes in consumed current in the correction current amplifying circuit 40, and line Z represents the total consumed current in the analog signal output section 20 and the correction current amplifying circuit 40.

Generally, as represented in FIG. 4A, consumed current varies linearly with increase in gain settings value. In the example of FIG. 4A, the consumed current linearly decreases.

In the DA converter 10 using the correction current amplifying circuit 40, as represented in FIG. 4B, the consumed current Y of the correction current amplifying circuit 40 linearly varies with the slope of the opposite sign from the consumed current X of the analog signal output section 20. In the example of FIG. 4B, the consumed current Y linearly increases.

Thus, as represented by line Z in FIG. 4B, the overall current in the DA converter 10 can be maintained constant regardless of the gain settings, by accurately complementing the amount of current fluctuation due to changes in gain settings, using the correction current amplifying circuit 40.

Note that no timing control is required in the correction current amplifying circuit 40.

FIGS. 5A and 5B are diagrams representing current fluctuations as a function of time in the presence of gain switching.

FIG. 5A represents a current fluctuation (change) characteristic in the comparative example. FIG. 5B represents a current fluctuation (change) characteristic in the DA converter that uses the correction current amplifying circuit of the presently described embodiment.

In FIGS. 5A and 5B, the horizontal axis represents time, and the vertical axis represents current.

In the examples of FIGS. 5A and 5B, the gain switching is from "00 db" to "06 db", and the digital input signal DI11 is sequentially switched from high level to low level.

As represented in FIG. 5A, in the comparative example, the current fluctuations in the DA converter cause fluctuations in the power supply Vdd level and ground GND level by, for example, the parasitic resistance or parasitic inductance of the power supply Vdd or ground GND, which in turn cause output fluctuations in the DA converter. Thus, a settling time to stabilize the power supply Vdd and GND level is needed.

In contrast, as represented in FIG. 5B, the overall current of the DA converter 10 remains constant, and therefore the DA converter 10 does not require a stabilizing wait time for the power supply Vdd level and GND level.

FIGS. 6A and 6B represent output fluctuations of the DA converter with time in the presence of gain switching.

FIG. 6A represents an output fluctuation characteristic of the comparative example. FIG. 6B represents an output fluctuation characteristic of the DA converter that uses the correction current amplifying circuit of the presently described embodiment.

In FIGS. 6A and 6B, the horizontal axis represents time, and the vertical axis represents current.

In the examples of FIGS. 6A and 6B, the gain switching is from "00 db" to "06 db", and the digital input signal DI11 is sequentially switched from high level to low level.

In the comparative example, no fluctuations occur in the power supply Vdd level and ground GND level in an ideal state in which, for example, there is no parasitic resistance or parasitic inductance in the power supply Vdd and ground GND.

However, parasitic components do exist in actual practice, and cause output fluctuations in the DA converter, as represented in FIG. 6A, necessitating a settling time to stabilize the power supply Vdd level and ground GND level.

In contrast, in the DA converter 10, the overall current remains constant, and therefore the DA converter 10 does not require a stabilizing wait time for the power supply Vdd level and ground GND level.

The following describes the operations according to the foregoing configuration.

In the gain control signal generating section 30, the NMOS transistors NT33 in the differential transistors of the basic current supply cells 31-1 to 31-n are selected according to the decode information (gain settings value) from the gain decoder 60.

In response, the current outputs of the selected basic current supply cells are added to produce a gain current Igain the flows into the select line L31. The gain current Igain is then converted to a voltage signal in the PMOS transistor DP31, and output to the analog signal output section 20.

The other NMOS transistors NT32 in the basic current supply cells 31-1 to 31-n are selected according to the decode information from the gain decoder 60.

In this case, the current outputs of the selected basic current supply cells are added to produce a non-select current Igain_minus supplied to the correction current amplifying circuit 40 via the non-select line NL31.

In the analog signal output section 20, the PMOS transistors PT23 in the differential transistors of the basic current supply cells 21-1 to 21-n are selected according to the decode information of the counter decoder 50 for the digital input signal DI11.

Specifically, the input clock to the counter decoder 50 is counted, the number of selected current supply cells is determined based on the counted value, and the PMOS transistors PT23 of the differential transistors are selected.

In response, the current outputs of the selected basic current supply cells are added to produce an output current Iramp that flows into a select output line LO21. The current Iramp is then converted to a voltage signal by the output resistor R21, and output from the node ND21.

The other PMOS transistors PT22 in the basic current supply cells 21-1 to 21-n are selected according to the decode information form the counter decoder 50.

In this case, the current outputs of the selected basic current supply cells are added to produce a non-output current Iramp_minus that flows into ground GND via the non-select output line NLO21.

The correction current amplifying circuit 40 receives the non-select current Igain_minus via the non-select line NL31, and generates a correction current Icorct that accurately complements an amount of current fluctuation due to changes in gain settings that occur in the gain control signal generating section 30.

The correction current amplifying circuit 40 supplies the generated correction current Icorct to the junction between the non-select output line NLO21 of the analog signal output section 20 and ground GND via a correction current line LIC11.

As a result, the non-output current Iramp_minus is corrected by the correction current Icorct from the correction current amplifying circuit 40.

By the correction current amplifying circuit 40, the correction current Icorct that accurately complements an amount of current fluctuation due to changes in gain settings is added to the non-output current Iramp_minus.

In this way, the total consumed current in the analog signal output section 20 and the correction current amplifying circuit 40 is maintained constant regardless of the gain settings.

Accordingly, the overall current of the DA converter 10 is maintained constant, regardless of the gain settings.

As described above, according to the First Embodiment, the consumed current in the DA converter 10 can be maintained constant regardless of the gain settings.

Because there is no current fluctuation at the gain switching, the settling time for the stable operation of the DA converter at the gain switching can be reduced.

This is particularly effective in systems that perform gain switching for each scan.

Further, because a narrow band operation is possible in the power supply circuit system, the power-supply noise can be reduced.

The present invention is not limited to the foregoing example described based on a ground-based DA converter, and is also applicable to power supply-based DA converters.

2. Second Embodiment

Second Exemplary Configuration of DA Converter

FIG. 7 is a circuit diagram illustrating an exemplary configuration of a DA converter according to a Second Embodiment of the present invention.

A DA converter 10A according to the Second Embodiment is configured as a power supply-based DA converter.

The DA converter 10A includes an analog signal output section 20A, a gain control signal generating section 30A, a correction current amplifying circuit 40A provided as a correction current generating section, a counter decoder 50A, and a gain decoder 60A.

The analog signal output section 20A generates an analog signal according to a value of a digital input signal DI11 decoded by the counter decoder 50A.

The analog signal output section 20A adjusts the gain of the analog signal generated according to a bias voltage Vbias supplied as a gain control signal from the gain control signal generating section 30A.

The analog signal output section 20A illustrated in FIG. 7 includes a plurality of basic current supply cells 21A-1 to 21A-$n$, each including a differential transistor, and a transistor provided as a current supply for the differential transistor. The basic current supply cells 21A-1 to 21A-$n$ receives a common bias voltage through the gates of first current supply transistors.

In the power supply-based DA converter 10A, the basic current supply cells 21A-1 to 21A-$n$ are formed by NMOS transistors.

The analog signal output section 20A also includes a select output line LO21A, a non-select output line NLO21A, and an output resistor R21A that serves as an IV converting circuit.

The basic current supply cells 21A-1 to 21A-$n$ of the analog signal output section 20A have a common structure.

Specifically, the basic current supply cells 21A(-1 to -$n$) each include NMOS transistors NT21 to NT23.

The NMOS transistor NT21 forms the first current supply transistor serving as the current supply.

The NMOS transistors NT22 and NT23 form a differential transistor by being connected to each other at the source.

In the basic current supply cells 21A, the source of the NMOS transistor NT21 is connected to ground GND, and the drain to the sources of the NMOS transistors NT22 and NT23.

The drain of the NMOS transistor NT22 is connected to the non-select output line NLO21A, which is directly connected to power supply Vdd.

The drain of the NMOS transistor NT23 is connected to the select output line LO21A, which is connected to one end of the output resistor R21A. The other end of the output resistor R21A is connected to the power supply Vdd.

In the basic current supply cells 21A-1 to 21A-$n$, the gates of the NMOS transistors NT21 are commonly connected to a supply line LVB11A of a bias voltage Vbias—a gain control signal from the gain control signal generating section 30A.

The gates of the NMOS transistors NT22 are connected to the supply line of a digital signal Qin, and the gates of the NMOS transistors NT23 are connected to the supply line of a signal xQin of the reversed phase from the digital signal Qin.

In the basic current supply cells 21-1A to 21A-$n$, the drains of the NMOS transistors NT23—one of the transistors forming the differential transistor—are commonly connected to the select output line LO21A, and the drains of the other NMOS transistors NT22 are commonly connected to the non-select output line NLO21A.

As mentioned above, the select output line LO21A is connected to one end of the output resistor R21A, and the analog signal output of the analog signal output section 20A is made at a connection node ND21A.

In the analog signal output section 20A, the NMOS transistors NT23 provided as one of the transistors of the differential transistors in the basic current supply cells 21A-1 to 21A-$n$ are selected according to the decode information from the counter decoder 50A.

The current outputs of the selected basic current supply cells are added to produce an output current Iramp that flows in the select output line LO21A. The current Iramp is then converted into a voltage signal by the output resistor R21A, and output from the node ND21A.

The other NMOS transistors NT22 in the basic current supply cells 21A-1 to 21A-$n$ are selected according to the decode information from the counter decoder 50A.

In this case, the current outputs of the selected basic current supply cells are added to produce a non-output current Iramp_minus that flows into the power supply Vdd via the non-select output line NLO21A.

The non-output current Iramp_minus is corrected by a correction current Icorct of the correction current amplifying circuit 40A.

The gain control signal generating section 30A illustrated in FIG. 7 generates the bias voltage Vbias, a gain control signal according to the value of a digital gain control signal DGI11 decoded by the gain decoder 60A.

The bias voltage Vbias generated in the gain control signal generating section 30A is output to the analog signal output section 20A as a gain adjusting signal.

The gain control signal generating section 30A includes a plurality of basic current supply cells 31A-1 to 31A-$n$, each including a differential transistor, and a transistor provided as a current supply for the differential transistor. The basic current supply cells 31A-1 to 31A-$n$ receive a bias voltage according to a common reference current through the gates of first current supply transistors.

In the power supply-based DA converter 10A, the basic current supply cells 31A-1 to 31A-$n$ are formed by PMOS transistors.

The gain control signal generating section 30A also includes a select line L31A, a non-select line NL31A, and a diode-connected PMOS transistor DP31 and NMOS transistor DN31 that serve as an IV converting circuit.

The NMOS transistor DN31 corresponds to a first diode-connected transistor.

The basic current supply cells 31A-1 to 31A-$n$ of the gain control signal generating section 30A have a common structure.

Specifically, the basic current supply cells 31A (-1 to -$n$) each include PMOS transistors PT31 to PT33.

The PMOS transistor PT31 forms the current supply transistor.

The PMOS transistors PT32 and PT33 form a differential transistor by being connected to each other at the source.

In the basic current supply cells 31A, the source of the PMOS transistor PT31 is connected to power supply Vdd, and the drain to the sources of the PMOS transistors PT32 and PT33.

The drain of the PMOS transistor PT32 is connected to the non-select line NL31A, which is connected to the correction current amplifying circuit 40A.

The drain of the PMOS transistor PT33 is connected to the select line L31A.

The select line L31A is connected to the drain and gate of the NMOS transistor DN31, and the connection node is connected to the gates of the current supply transistors of the basic current supply cells 21A-1 to 21A-$n$ in the analog signal output section 20A.

Specifically, a first current mirror circuit CMR21A is formed by the NMOS transistor DN31 of the gain control signal generating section 30A, and the current supply NMOS transistors NT21 of the basic current supply cells 21A-1 to 21A-$n$ in the analog signal output section 20A.

In the basic current supply cells 31A-1 to 31A-$n$, the gates of the PMOS transistors PT31 are commonly connected to a supply line LVB12A of a reference voltage Vref at the PMOS transistor DP31 that serves as an IV converting circuit.

The gates of the PMOS transistors PT32 are connected to a supply line of a signal Gin, and the gates of the PMOS transistors PT33 are connected to a supply line of a signal xGin of the reversed phase from the signal Gin.

The source of the PMOS transistor DP31 is connected to power supply Vdd, and the drain and gate to a supply line of a reference current Iref. The junction (gate) is connected to the gates of the PMOS transistors PT31 of the basic current supply cells 31A-1 to 31A-$n$.

In the basic current supply cells 31A-1 to 31A-n, the drains of the PMOS transistors PT33—one of the transistors of the differential transistors—are commonly connected to the select line L31A, and the drains of the other PMOS transistors PT32 are commonly connected to the non-select line NL31A.

The PMOS transistors PT33 provided as one of the transistors of the differential transistors in the basic current supply cells 31A-1 to 31A-n are selected according to the decode information from the gain decoder 60A.

The current outputs of the selected basic current supply cells are added to produce a gain current Igain that flows in the select line L31A. The gain current Igain is converted to a voltage signal in the NMOS transistor DN31, and output to the analog signal output section 20A.

The other PMOS transistors PT32 in the basic current supply cells 31A-1 to 31A-n are selected according to the decode information from the gain decoder 60A.

In this case, the current outputs of the selected basic current supply cells are added to produce a non-select current Igain_minus supplied to the correction current amplifying circuit 40A via the non-select line NL31A.

The correction current amplifying circuit 40A receives the non-select current Igain_minus via the non-select line NL31A, and generates a correction current Icorct that accurately complements an amount of current fluctuation due to changes in gain settings that occur in the gain control signal generating section 30A.

The correction current amplifying circuit 40A supplies the generated correction current Icorct to the junction between the non-select output line NLO21A of the analog signal output section 20A and power supply Vdd via a correction current line LIC11A.

By the correction current amplifying circuit 40A, the correction current Icorct that accurately complements an amount of current fluctuation due to changes in gain settings is added to the non-output current Iramp_minus. In this way, the total consumed current in the analog signal output section 20A and the correction current amplifying circuit 40A is maintained constant regardless of the gain settings.

Accordingly, the overall current of the DA converter 10A is maintained constant, regardless of the gain settings.

The correction current amplifying circuit 40A includes an NMOS transistor DN41 (IV converting circuit), current-supply NMOS transistors NT41, and output NMOS transistors NT42.

The NMOS transistor DN41 is diode-connected, and has the function equivalent to that of the NMOS transistor DN31 of the gain control signal generating section 30A.

The NMOS transistors NT41 have the function equivalent to that of the current-supply NMOS transistors NT21 of the basic current supply cells 21A-1 to 21A-n in the analog signal output section 20A.

The NMOS transistors NT42 have the function equivalent to that of the NMOS transistor NT22 or NT23 in the differential transistors of the basic current supply cells 21A-1 to 21A-n in the analog signal output section 20A.

In the correction current amplifying circuit 40A, the number of parallels of the NMOS transistors NT41 and NT42 is set to the number n of the basic current supply cells 21A-1 to 21A-n in the analog signal output section 20A.

The NMOS transistor DN41 corresponds to a second diode-connected transistor. The NMOS transistor NT41 corresponds to a second current supply transistor. The NMOS transistor NT42 corresponds to an output transistor.

The drain and gate of the NMOS transistor DN41 are connected to the non-select line NL31A, and the source is connected to ground GND.

The gate of the NMOS transistor DN41 is connected to a supply line LVB13A of a bias voltage Vbias2.

The sources of the n NMOS transistors NT41 are connected to the ground GND, and the drains to the sources of the n NMOS transistors NT42.

The gates of the n NMOS transistors NT41 are commonly connected to the supply line LVB13A of the bias voltage Vbias2 connected to the gate of the NMOS transistor DN41.

The gates of the n NMOS transistors NT42 are commonly connected to power supply Vdd.

Specifically, the gates of the n NMOS transistors NT42 are maintained at a power supply potential, and are thus in the ON state.

The drains of the n NMOS transistors NT42 are commonly connected to one end of the correction current line LIC11A. The other end of the correction current line LIC11A is connected to one end of the output resistor R21A of the analog signal output section 20A, and to the junction between the non-select output line NLO21A and power supply Vdd.

In the correction current amplifying circuit 40A, a second current mirror circuit CMR41A is formed by the diode-connected NMOS transistor DN41, and the n NMOS transistors NT41.

The second current mirror circuit CMR41A has a current mirror ratio that matches the input-output current mirror ratio of a first current mirror circuit CMR21A.

Note that, as described above, the current mirror circuit CMR21A is formed by the NMOS transistor DN31 of the gain control signal generating section 30A, and the current-supply NMOS transistors NT21 of the basic current supply cells 21A-1 to 21A-n in the analog signal output section 20A.

That is, the correction current amplifying circuit 40A performs current amplification at the same current mirror ratio as that of the current mirror circuit CMR21A formed by the NMOS transistor DN31 and the current-supply NMOS transistors NT21 of the basic current supply cells 21A-1 to 21A-n.

The discussion on the power consumption and other characteristics of the DA converter 10A that uses the correction current amplifying circuit 40A of the present embodiment is essentially as in the DA converter 10 described in the First Embodiment with reference to FIGS. 4A and 4B to FIGS. 6A and 6B.

Accordingly, details will not be described further.

The following describes the operations according to the foregoing configuration.

In the gain control signal generating section 30A, the PMOS transistors PT33 in the differential transistors of the basic current supply cells 31A-1 to 31A-n are selected according to the decode information (gain settings value) from the gain decoder 60A.

In response, the current outputs of the selected basic current supply cells are added to produce a gain current Igain the flows into the select line L31A. The gain current Igain is then converted to a voltage signal in the NMOS transistor DN31, and output to the analog signal output section 20A.

The other PMOS transistors PT32 in the basic current supply cells 31A-1 to 31A-n are selected according to the decode information from the gain decoder 60A.

In this case, the current outputs of the selected basic current supply cells are added to produce a non-select current Igain_minus supplied to the correction current amplifying circuit 40A via the non-select line NL31A.

In the analog signal output section 20A, the NMOS transistors NT23 in the differential transistors of the basic current supply cells 21A-1 to 21A-n are selected according to the decode information of the counter decoder 50A for the digital input signal DI11.

Specifically, the input clock to the counter decoder 50A is counted, the number of selected current supply cells is determined based on the counted value, and the NMOS transistors NT23 of the differential transistors are selected.

In response, the current outputs of the selected basic current supply cells are added to produce an output current Iramp that flows into a select output line LO21A. The current Iramp is then converted to a voltage signal by the output resistor R21A, and output from the node ND21A.

The other NMOS transistors NT22 in the basic current supply cells 21A-1 to 21A-$n$ are selected according to the decode information form the counter decoder 50A.

In this case, the current outputs of the selected basic current supply cells are added to produce a non-output current Iramp_minus that flows into power supply Vdd via the non-select output line NLO21A.

The correction current amplifying circuit 40A receives the non-select current Igain_minus via the non-select line NL31A, and generates a correction current Icorct that accurately complements an amount of current fluctuation due to changes in gain settings that occur in the gain control signal generating section 30A.

The correction current amplifying circuit 40A supplies the generated correction current Icorct to the junction between the non-select output line NLO21A of the analog signal output section 20A and power supply Vdd via a correction current line LIC11A.

As a result, the non-output current Iramp_minus is corrected by the correction current Icorct from the correction current amplifying circuit 40A.

By the correction current amplifying circuit 40A, the correction current Icorct that accurately complements an amount of current fluctuation due to changes in gain settings is added to the non-output current Iramp_minus.

In this way, the total consumed current in the analog signal output section 20A and the correction current amplifying circuit 40A is maintained constant regardless of the gain settings.

Accordingly, the overall current of the DA converter 10A is maintained constant, regardless of the gain settings.

The effects described in the First Embodiment can similarly be obtained in the Second Embodiment.

The DA converters 10 and 10A having such effects are applicable as the DA converters of solid-state imaging devices.

The DA converter of the present embodiment is not particularly limited, and is applicable to, for example, CMOS image sensors provided with column-parallel AD converters.

3. Third Embodiment

Exemplary Overall Configuration of Solid-State Imaging Device

Figure 8:
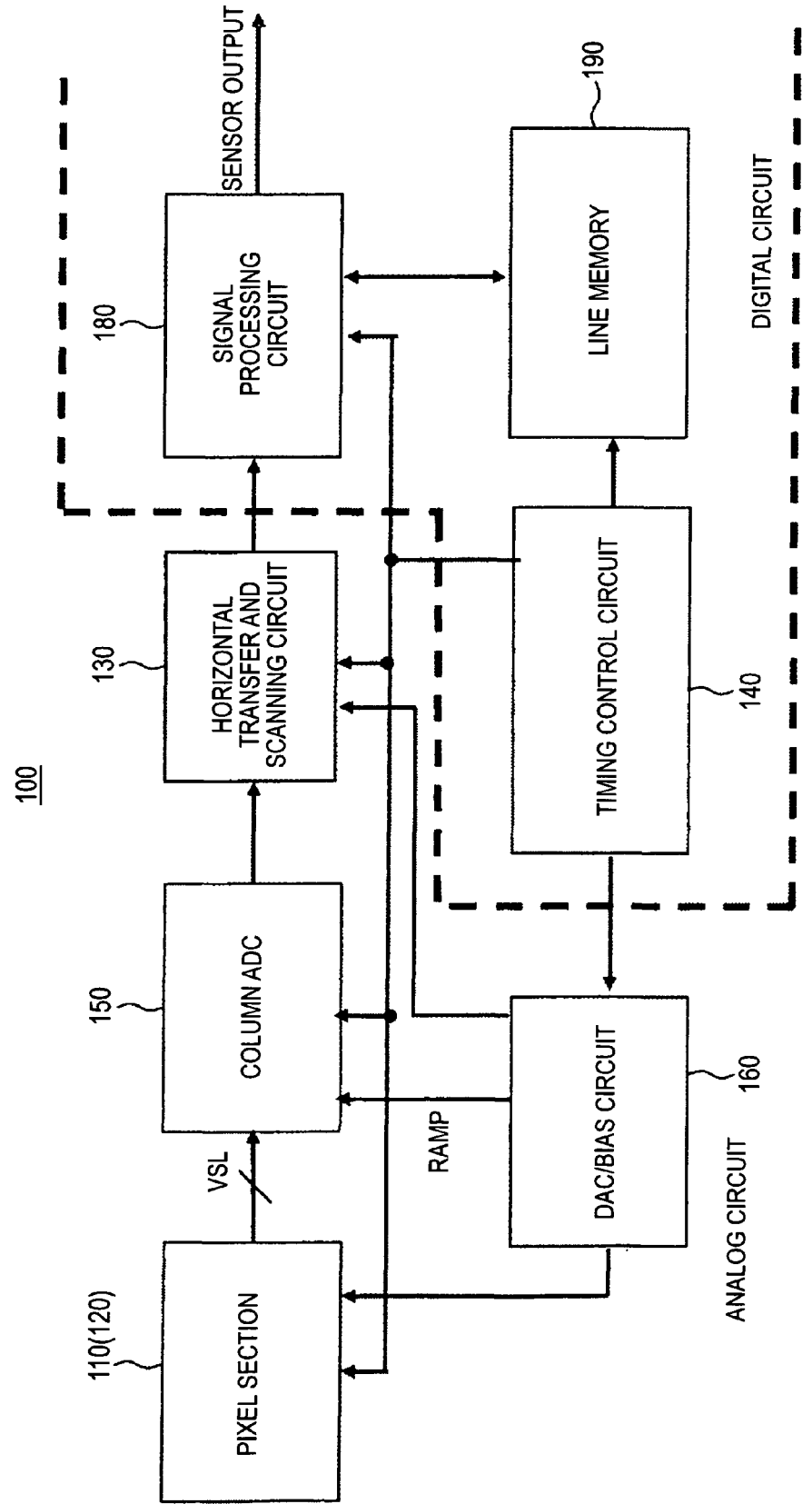
FIG. 8 is a block diagram illustrating an exemplary configuration of a column-parallel ADC-installed solid-state imaging device (CMOS image sensor) according to an embodiment of the present invention.

FIG. 8 is a block diagram illustrating an exemplary configuration of a column-parallel ADC-installed solid-state imaging device (CMOS image sensor) according to a Third Embodiment of the present invention.

Figure 9:
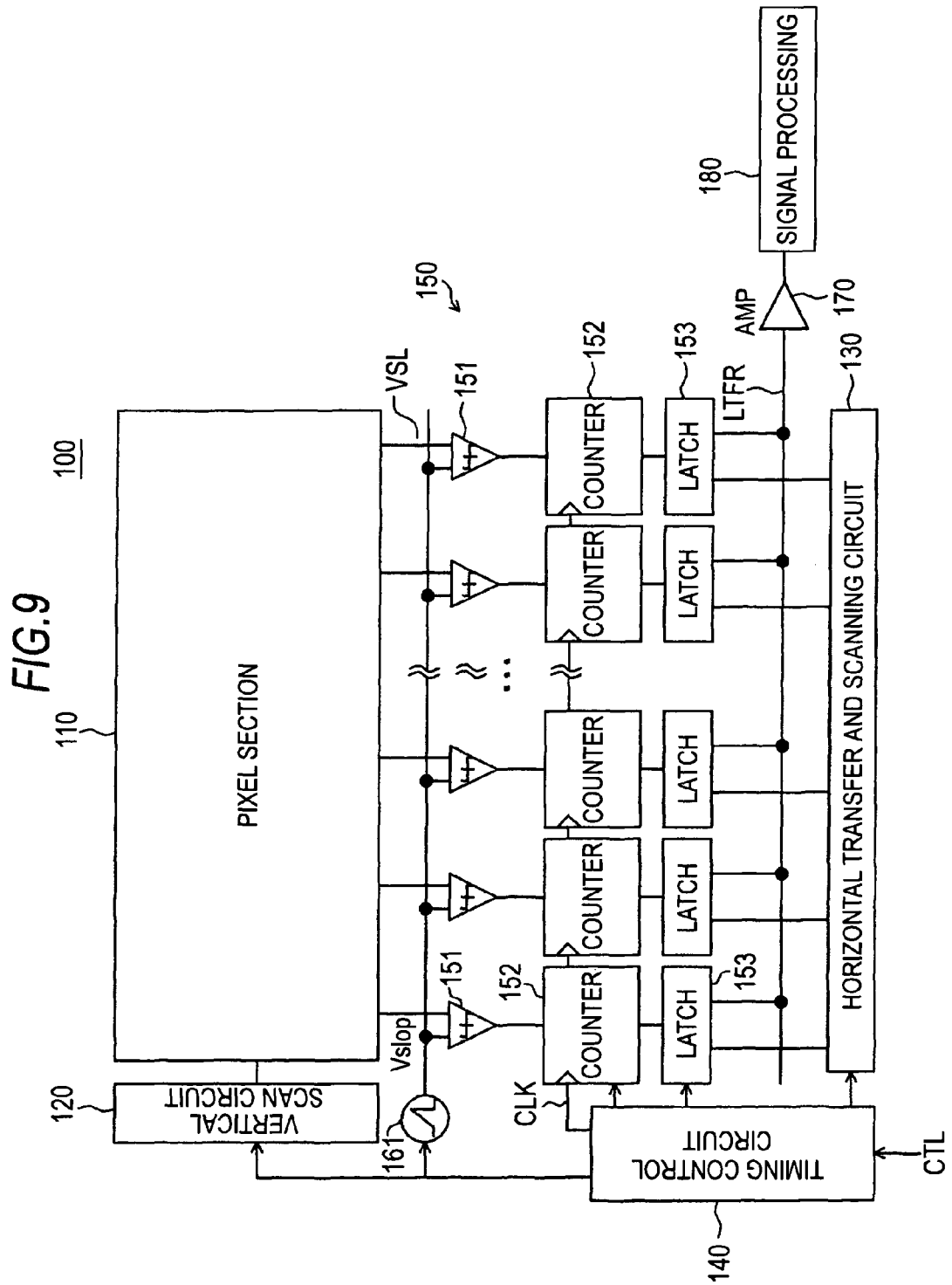
FIG. 9 is a block diagram specifically illustrating an ADC group in the column-parallel ADC-installed solid-state imaging device (CMOS image sensor) of FIG. 8.

FIG. 9 is a block diagram specifically illustrating an ADC group in the column-parallel ADC-installed solid-state imaging device (CMOS image sensor) of FIG. 8.

As illustrated in FIG. 8 and FIG. 9, a solid-state imaging device 100 includes a pixel section 110 (imaging section), a vertical scan circuit 120, a horizontal transfer scan circuit 130, a timing control circuit 140, and an ADC group 150 (pixel signal reading section).

The solid-state imaging device 100 also includes DAC and bias circuit 160 (including a DA converter 161), an amplifying circuit (S/A) 170, a signal processing circuit 180, and a line memory 190.

Of these constituting elements, the pixel section 110, the vertical scan circuit 120, the horizontal transfer scan circuit 130, the ADC group 150, the DAC and bias circuit 160, and the amplifying circuit (S/A) 170 are realized by analog circuits.

The timing control circuit 140, the signal processing circuit 180, and the line memory 190 are realized by digital circuits.

In the pixel section 110, pixels including photodiodes and pixel amplifiers are disposed in a matrix (in rows and columns).

Figure 10:
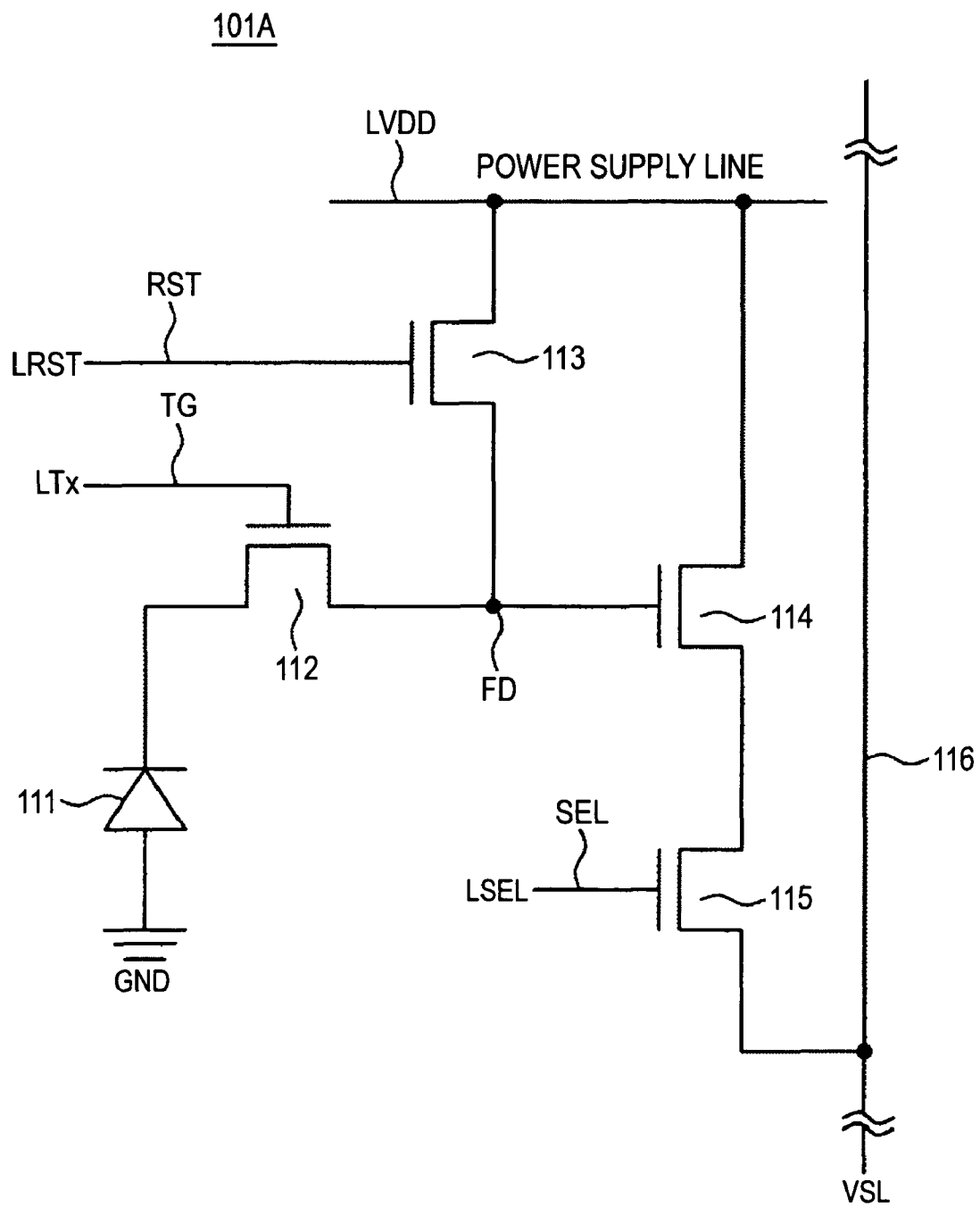
FIG. 10 is a diagram illustrating an example of a CMOS image sensor pixel with four transistors according to an embodiment of the present invention.

FIG. 10 is a diagram illustrating an example of a CMOS image sensor pixel with four transistors according to the present embodiment.

A pixel circuit 101A includes, for example, a photodiode 111 as a photoelectric conversion element.

The pixel circuit 101A includes only a single photodiode 111 as a photoelectric conversion element.

The pixel circuit 101A includes four transistors for the single photodiode 111: a transfer transistor 112 (transfer element), a reset transistor 113 (reset element), an amplification transistor 114, and a select transistor 115.

The photodiode 111 photoelectrically converts incident light into charges (here, electrons) according to the light quantity.

The transfer transistor 112 is connected between the photodiode 111 and a floating diffusion FD (Floating Diffusion; output node).

The transfer transistor 112 receives a drive signal TG at the gate (transfer gate) through a transfer control line LTx, and in response transfers the photoelectrically converted electrons in the photodiode 111 to the floating diffusion FD.

The reset transistor 113 is connected between a power supply line LVDD and the floating diffusion FD.

The reset transistor 113 receives a reset RST at the gate through a reset control line LRST, and in response resets the potential of the floating diffusion FD to the potential of the power supply line LVDD.

The floating diffusion FD is connected to the gate of the amplification transistor 114. The amplification transistor 114 is connected to a vertical signal line 116 via the select transistor 115 so as to form a source follower with a constant current supply external to the pixel section.

The select transistor 115 is turned on in response to a control signal (address signal or select signal) SEL supplied to the gate of the select transistor 115 through a select control line LSEL.

With the select transistor 115 turned on, the amplification transistor 114 amplifies the potential of the floating diffusion FD, and outputs a voltage according to the amplified potential to the vertical signal line 116. The output voltage from each pixel is sent to the ADC group 150 (pixel signal read circuit) through the vertical signal line 116.

These operations are simultaneously performed for the pixels of a single row, because, for example, the gates of the transfer transistor 112, the reset transistor 113, and the select transistor 115 are connected in units of rows.

The reset control line LRST, the transfer control line LTx, and the select control line LSEL of pixel section 110 are wired in a set in units of rows of the pixel array.

The reset control line LRST, the transfer control line LTx, and the select control line LSEL are driven by the vertical scan circuit 120 provided as a pixel driving section.

In the solid-state imaging device 100 are disposed a timing control circuit 140 provided as a control circuit to generate internal clocks for sequentially reading the signals of the pixel section 110, a vertical scan circuit 120 that controls the row address and row scan, and a horizontal transfer scan circuit 130 that controls the column address and column scan.

The timing control circuit 140 generates timing signals necessary for the signal processing in the pixel section 110, the vertical scan circuit 120, the horizontal transfer scan circuit 130, the ADC group (column ADC circuit) 150, the DAC and bias circuit 160, the signal processing circuit 180, and the line memory 190.

The pixel section 110 performs photoelectric conversion for videos and screen images in units of pixel rows by, for example, photon accumulation and discharge using a line shutter, and outputs the analog signal VSL to the ADC group.

In the ADC group 150, the analog output of the pixel section 110 is subjected to APGA-compatible integrating ADC that uses the ramp signal RAMP from the DA converter (DAC) 161, and to digital CDS in each ADC block (each column section), and the ADC group 150 outputs digital signals of several bits.

Figure 11:
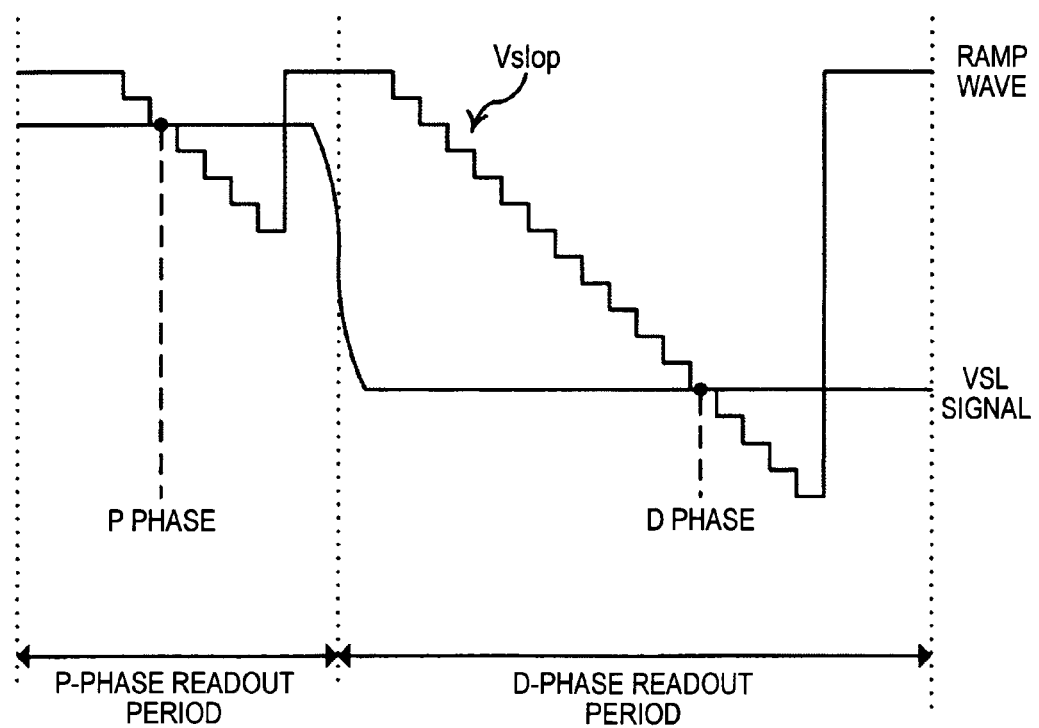
FIG. 11 is a diagram representing an example of a ramp (RAMP) waveform generated by the DA converter of FIG. 8 and FIG. 9, and operation timing of ADC.

FIG. 11 is a diagram representing an example of the ramp (RAMP) waveform generated by the DA converter of FIG. 8 and FIG. 9, and the operation timing of the ADC.

The ADC group 150 includes a plurality of ADCs disposed in columns.

The DA converter 161 generates a reference voltage Vslop of a step-like ramp waveform (RAMP) as represented in FIG. 11.

Each ADC includes a comparator 151 that compares the reference voltage Vslop with an analog signal (potential VSL) obtained from each row of the pixels via the vertical signal line 116.

Further, the ADCs each include a counter 152 that counts a comparison time, and a latch (memory) 153 that holds the count result.

The ADC group 150 has a k-bit digital signal conversion function, and forms column-parallel ADC blocks disposed to respectively correspond to the vertical signal lines (column lines).

The output of each latch 153 is connected to a horizontal transfer line LTRF of, for example, a k bit width.

Also disposed are k amplifying circuits 170 corresponding to the horizontal transfer line LTRF, and the signal processing circuit 180.

Specific structures and functions of the comparator 151 will be described later in detail.

In the ADC group 150, the comparator 151 disposed for each column compares the analog signal (potential VSL) read into the vertical signal line 116 with the reference voltage Vslop (ramp signal RAMP with a sloped waveform that linearly varies with a certain slope).

Here, the counter 152 disposed per column as with the comparator 151 also comes into operation, converting the potential VSL of the vertical signal line 116 into a digital signal as a result of one-to-one changes between the ramp signal RAMP (potential Vslop) of a ramp waveform and the counter value.

In the ADC, changes in the reference voltage Vslop (ramp signal RAMP) are converted to changes in time, and the time is counted in certain cycles (clocks) for conversion into digital values.

The output of the comparator 151 is inverted upon crossing of the analog signal VSL and the ramp signal RAMP (reference voltage Vslop), upon which the input clock to the counter 152 is stopped, or the suspended clock is input to the counter 152 to complete the AD conversion.

After the period of AD conversion, the horizontal transfer scan circuit 130 transfers the data held in the latch 153 to the horizontal transfer line LTRF, and the data is input to the signal processing circuit 180 via the amplifying circuit 170. After predetermined signal processing, a two-dimensional image is produced.

To ensure transfer speed, the horizontal transfer scan circuit 130 performs a simultaneous parallel transfer for several channels.

The timing control circuit 140 generates the necessary timing for the signal processing in each block, including the pixel section 110 and the ADC group 150.

The signal processing circuit 180 of the subsequent stage performs the correction of vertical line defects or dot defects from the signals stored in the line memory 190, along with signal clamping, or various digital signal processing including parallel-serial conversion, compression, coding, addition, averaging, and intermittent operation.

The line memory 190 stores the digital signals sent in units of pixel rows.

In the solid-state imaging device 100 of the present embodiment, the digital output of the signal processing circuit 180 is sent out as an input to an ISP or a baseband LSI.

The following describes the operations according to the foregoing configuration.

At P phase, the DA converter 161 generates a reference voltage Vslop.

In the column processing circuit (ADC) 150, the comparator 151 disposed per column compares the analog signal potential VSL read into the vertical signal line 116 with the step-like reference voltage Vslop.

Here, the counter 152 keeps counting until the levels of the analog potential VSL and the reference voltage Vslop cross and the output of the comparator 151 is inverted, thus converting the potential (analog signal) VSL of the vertical signal line 116 into a digital signal (AD conversion).

In the AD conversion, the changes in the reference voltage Vslop with a sloped waveform that linearly varies with a certain slope are converted to changes in time, and the time is counted in certain cycles (clocks) for conversion into digital signals.

Upon crossing of the analog signal VSL and the reference voltage Vslop, the output of the comparator 151 is inverted, upon which the clock CLK input to the counter 152 is stopped to complete the AD conversion.

Two AD conversions are performed for a single readout.

The first AD conversion occurs when the reset level of the pixel circuit 101A is read into the vertical signal line 116 (P phase readout).

The P-phase reset level contains pixel variation.

The second AD conversion occurs when the signal subjected to photoelectric conversion in the pixel circuit 101A is read into the vertical signal line 116 (D phase readout).

The D phase also contains pixel variation. Thus, correlated double sampling (CDS) can be realized by performing (D phase-P phase) from the results of the P-phase and D-phase conversions.

The signals converted into the digital signals are successively read into the amplifying circuit 170 via the horizontal transfer line LTRF from the horizontal (column) transfer scan circuit 130 and eventually output.

This completes the column-parallel output process.

The CMOS image sensor 100 as a solid-state imaging device according to the Third Embodiment uses the DA converter of the First or Second Embodiment for the DA converter (DAC) 161 that supplies the reference voltage to the AD converter (ADC).

Thus, the solid-state imaging device can maintain the consumed current of the DA converter 161 constant, regardless of the gain settings.

Because there is no current fluctuation at the gain switching, the settling time for the stable operation of the DA converter at the gain switching can be reduced.

The effect is particularly prominent in systems that involve gain switching per scan, as in the presently described system.

Further, because a narrow band operation is possible in the power supply circuit system, the power-supply noise can be reduced. With the reduced noise in the AD conversion, the quality of the captured image can be improved.

The solid-state imaging device having such effects can be used as an imaging device for digital cameras and video cameras.

4. Fourth Embodiment

Exemplary Configuration of Camera System

Figure 12:
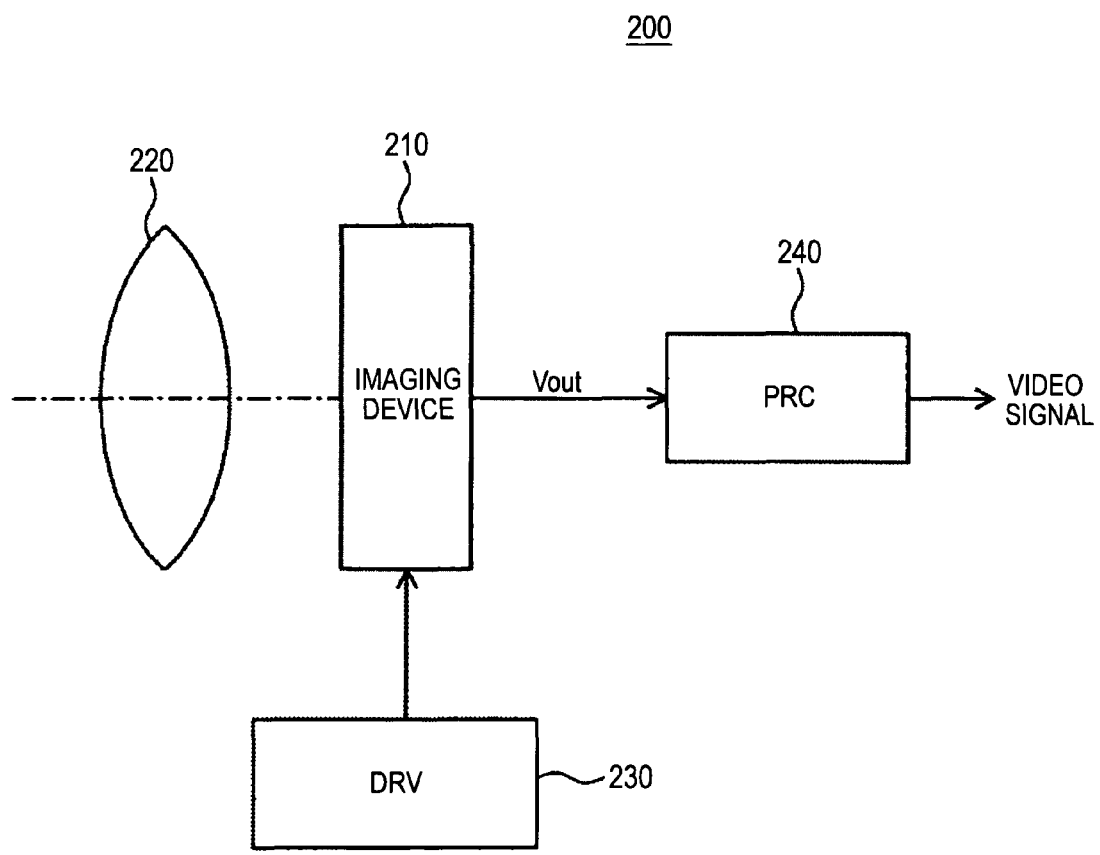
FIG. 12 is a diagram illustrating an exemplary configuration of a camera system that uses a solid-state imaging device according to an embodiment of the present invention.

FIG. 12 is a diagram illustrating an exemplary configuration of a camera system using a solid-state imaging device according to an embodiment of the present invention.

As illustrated in FIG. 12, a camera system 200 includes an imaging device 210 to which a solid-state imaging device 100 according to an embodiment of the present invention is applicable.

The camera system 200 includes an optical system that guides incident light to the pixel region of the imaging device 210 (forms an object image). For example, a lens 220 is provided that forms an image of the incident light (image light) on the imaging area.

The camera system 200 also includes a drive circuit (DRV) 230 that drives the imaging device 210, and a signal processing circuit (PRC) 240 that processes the output signal of the imaging device 210.

The drive circuit 230 includes a timing generator (not illustrated) that generates various timing signals including the start pulse and clock pulse used to drive the circuits in the imaging device 210, and drives the imaging device 210 with a predetermined timing signal.

The signal processing circuit 240 performs a predetermined signal process for the output signal of the imaging device 210.

The image signals processed in the signal processing circuit 240 are stored in a storage medium, for example, such as a memory. The image information stored in the storage medium is hardcopied with a machine such as a printer. The image signals processed in the signal processing circuit 240 are displayed as moving images on a monitor such as a liquid crystal display.

As described above, a high-resolution camera can be realized by installing the solid-state imaging device 100 as the imaging device 210 in imaging devices such as a digital still camera.

The present application contains subject matter related to that disclosed in Japanese Priority Patent Application JP 2009-105923 filed in the Japan Patent Office on Apr. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A DA converter comprising:
   an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential;
   a gain control signal generating section that generates a gain current and a non-select current according to a value of a digital gain control signal, and that generates the gain control signal by current-voltage conversion of the gain current and supplies the gain control signal to the analog signal output section; and
   a correction current generating section that generates, based on the non-select current of the gain control signal generating section, a correction current that complements an amount of current fluctuation due to changes in gain settings in the gain control signal generating section, and that causes the correction current to flow to the reference potential.

2. The DA converter according to claim 1,
   wherein a gain control signal output section of the gain control signal generating section, and a gain control signal input section of the analog signal output section form a first current mirror circuit of a predetermined current mirror ratio for the gain current, and
   the correction current generating section includes a second current mirror circuit that outputs the correction current in response to the non-select current, and that has a current mirror ratio matching the input-output current mirror ratio of the first current mirror circuit.

3. The DA converter according to claim 1,
   wherein the analog signal output section includes a plurality of basic current supply cells each of which includes a differential transistor and a first current supply transistor provided as a current supply for the differential transistor, and to which the gain control signal is supplied as a common bias voltage through control terminals of the first current supply transistors, wherein a signal according to a value of the digital input signal is supplied to control terminals of the differential transistors, and the differential transistors generate the output current by adding outputs of selected transistors, and the non-output current by adding outputs of the other transistors,
   the gain control signal generating section includes a diode-connected first diode-connected transistor that forms a current-voltage conversion element for the gain current, and that has a control terminal commonly connected to the control terminals of the first current supply transistors of the basic current supply cells in the analog signal output section, and
   the correction current generating section includes:
   a second diode-connected transistor that corresponds to the first diode-connected transistor of the gain control signal generating section;
   a second current supply transistor that corresponds to the current supply transistor of the analog signal output section; and
   an output transistor serially connected to the second current supply transistor, and that outputs the correction current corresponding to one of the transistors of the differential transistor, the second diode-connected transistor having a control terminal connected to a control terminal of the second current supply transistor.

4. The DA converter according to claim 3, wherein the serially connected second current supply transistor and output transistor in the correction current generating section are disposed in parallel corresponding in number to the basic current supply cells of the analog signal output section, and wherein the correction current generating section adds outputs of the output transistors to produce the output correction current.

5. The DA converter according to claim 1, wherein the gain control signal generating section includes a plurality of basic current supply cells each of which includes a differential transistor, and a transistor provided as a current supply for the differential transistor, and to which a common bias voltage is supplied through control terminals of the current supply transistors, wherein a signal according to a value of the digital gain control signal is supplied to control terminals of the differential transistors, and the differential transistors generate the gain current by adding outputs of selected transistors, and the non-select current by adding outputs of the other transistors.

6. A solid-state imaging device comprising:
a pixel section in which a plurality of pixels that performs photoelectric conversion is disposed in rows and columns;
a pixel signal read circuit that reads a pixel signal from the pixel section in units of pixels; and
a DA converter that generates a reference voltage of a ramp wave according to a supplied digital signal,
the pixel signal read circuit including
a plurality of comparators respectively corresponding to the columns of pixels, and that receives the reference voltage of a ramp wave and compares the reference voltage with an analog signal potential read out from the pixels of each column, and
a plurality of latches disposed to respectively correspond to the comparators and the columns of pixels, and capable of counting a comparison time of the corresponding comparators in such a manner as to stop counting and hold the counted value upon inversion of a comparator output,
the DA converter including
an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential,
a gain control signal generating section that generates a gain current and a non-select current according to a value of a digital gain control signal, and that generates the gain control signal by current-voltage conversion of the gain current and supplies the gain control signal to the analog signal output section, and
a correction current generating section that generates, based on the non-select current of the gain control signal generating section, a correction current that complements an amount of current fluctuation due to changes in gain settings in the gain control signal generating section, and that causes the correction current to flow to the reference potential.

7. A camera system comprising:
a solid-state imaging device; and
an optical system that forms an image of an object on the solid-state imaging device,
the solid-state imaging device including
a pixel section in which a plurality of pixels that performs photoelectric conversion is disposed in rows and columns,
a pixel signal read circuit that reads a pixel signal from the pixel section in units of pixels, and
a DA converter that generates a reference voltage of a ramp wave according to a supplied digital signal,
the pixel signal read circuit including
a plurality of comparators respectively corresponding to the columns of pixels, and that receives the reference voltage of a ramp wave and compares the reference voltage with an analog signal potential read out from the pixels of each column, and
a plurality of latches disposed to respectively correspond to the comparators and the columns of pixels, and capable of counting a comparison time of the corresponding comparators in such a manner as to stop counting and hold the counted value upon inversion of a comparator output,
the DA converter including
an analog signal output section that generates an output current and a non-output current according to a value of a digital input signal in response to a gain control signal supplied to adjust gain, and that outputs an analog signal produced by current-voltage conversion of the output current and causes the non-output current to flow to a reference potential,
a gain control signal generating section that generates a gain current and a non-select current according to a value of a digital gain control signal, and that generates the gain control signal by current-voltage conversion of the gain current and supplies the gain control signal to the analog signal output section, and
a correction current generating section that generates, based on the non-select current of the gain control signal generating section, a correction current that complements an amount of current fluctuation due to changes in gain settings in the gain control signal generating section, and that causes the correction current to flow to the reference potential.

8. The DA converter according to claim 2,
wherein the analog signal output section includes a plurality of basic current supply cells each of which includes a differential transistor and a first current supply transistor provided as a current supply for the differential transistor, and to which the gain control signal is supplied as a common bias voltage through control terminals of the first current supply transistors, wherein a signal according to a value of the digital input signal is supplied to control terminals of the differential transistors, and the differential transistors generate the output current by adding outputs of selected transistors, and the non-output current by adding outputs of the other transistors,
the gain control signal generating section includes a diode-connected first diode-connected transistor that forms a current-voltage conversion element for the gain current, and that has a control terminal commonly connected to the control terminals of the first current supply transistors of the basic current supply cells in the analog signal output section, and the correction current generating section includes:
- a second diode-connected transistor that corresponds to the first diode-connected transistor of the gain control signal generating section;
- a second current supply transistor that corresponds to the current supply transistor of the analog signal output section; and
- an output transistor serially connected to the second current supply transistor, and that outputs the correction current corresponding to one of the transistors of the differential transistor,
- the second diode-connected transistor having a control terminal connected to a control terminal of the second current supply transistor.

9. The DA converter according to claim 2, wherein the gain control signal generating section includes a plurality of basic current supply cells each of which includes a differential transistor, and a transistor provided as a current supply for the differential transistor, and to which a common bias voltage is supplied through control terminals of the current supply transistors, wherein a signal according to a value of the digital gain control signal is supplied to control terminals of the differential transistors, and the differential transistors generate the gain current by adding outputs of selected transistors, and the non-select current by adding outputs of the other transistors.

10. The DA converter according to claim 3, wherein the gain control signal generating section includes a plurality of basic current supply cells each of which includes a differential transistor, and a transistor provided as a current supply for the differential transistor, and to which a common bias voltage is supplied through control terminals of the current supply transistors, wherein a signal according to a value of the digital gain control signal is supplied to control terminals of the differential transistors, and the differential transistors generate the gain current by adding outputs of selected transistors, and the non-select current by adding outputs of the other transistors.

11. The DA converter according to claim 4, wherein the gain control signal generating section includes a plurality of basic current supply cells each of which includes a differential transistor, and a transistor provided as a current supply for the differential transistor, and to which a common bias voltage is supplied through control terminals of the current supply transistors, wherein a signal according to a value of the digital gain control signal is supplied to control terminals of the differential transistors, and the differential transistors generate the gain current by adding outputs of selected transistors, and the non-select current by adding outputs of the other transistors.

* * * * *